United States Patent
Lin et al.

(10) Patent No.: US 11,011,623 B2
(45) Date of Patent: May 18, 2021

(54) METHOD FOR INCREASING GERMANIUM CONCENTRATION OF FIN AND RESULTING SEMICONDUCTOR DEVICE

(71) Applicant: Taiwan Semiconductor Manufacturing Company, Ltd., Hsinchu (TW)

(72) Inventors: Che-Yu Lin, Hsinchu (TW); Chien-Hung Chen, Hsinchu (TW); Wen-Chu Hsiao, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/371,436

(22) Filed: Apr. 1, 2019

(65) Prior Publication Data
US 2020/0006530 A1   Jan. 2, 2020

Related U.S. Application Data

(60) Provisional application No. 62/692,018, filed on Jun. 29, 2018.

(51) Int. Cl.
*H01L 29/66*   (2006.01)
*H01L 21/02*   (2006.01)
(Continued)

(52) U.S. Cl.
CPC .. *H01L 29/66795* (2013.01); *H01L 21/02164* (2013.01); *H01L 21/02271* (2013.01);
(Continued)

(58) Field of Classification Search
None
See application file for complete search history.

(56) References Cited

U.S. PATENT DOCUMENTS 9,093,530 B2    7/2015   Huang et al.
9,166,044 B2 *  10/2015  Lu ..................... H01L 29/0649
(Continued)

OTHER PUBLICATIONS

Dyatko, N.A., et. al., "Actinometric Method for Measuring Hydrogen-Atom Density in a GLow Discharge Plasma", Plasma Physics Reports, vol. 24, No. 12 (1998), pp. 1041-1050. (Year: 1998).*
(Continued)

*Primary Examiner* — J. E. Schoenholtz
(74) *Attorney, Agent, or Firm* — Slater Matsil, LLP

(57) ABSTRACT

In an embodiment, a device includes: a substrate; a first semiconductor layer extending from the substrate, the first semiconductor layer including silicon; a second semiconductor layer on the first semiconductor layer, the second semiconductor layer including silicon germanium, edge portions of the second semiconductor layer having a first germanium concentration, a center portion of the second semiconductor layer having a second germanium concentration, the second germanium concentration being less than the first germanium concentration, the edge portions of the second semiconductor layer including sides and a top surface of the second semiconductor layer; a gate stack on the second semiconductor layer; lightly doped source/drain regions in the second semiconductor layer, the lightly doped source/drain regions being adjacent the gate stack; and source and drain regions extending into the lightly doped source/drain regions.

20 Claims, 22 Drawing Sheets

(51) Int. Cl.

| | | |
|---|---|---|
| *H01L 21/3065* | (2006.01) | |
| *H01L 21/30* | (2006.01) | |
| *H01L 29/40* | (2006.01) | |
| *H01L 29/08* | (2006.01) | |
| *H01L 21/762* | (2006.01) | |
| *H01L 29/165* | (2006.01) | |
| *H01L 29/78* | (2006.01) | |
| *H01L 21/3105* | (2006.01) | |
| *H01L 21/311* | (2006.01) | |
| *H01L 21/265* | (2006.01) | |

(52) U.S. Cl.
CPC .. *H01L 21/02381* (2013.01); *H01L 21/02532* (2013.01); *H01L 21/3003* (2013.01); *H01L 21/3065* (2013.01); *H01L 21/31053* (2013.01); *H01L 21/31116* (2013.01); *H01L 21/76224* (2013.01); *H01L 29/0847* (2013.01); *H01L 29/165* (2013.01); *H01L 29/401* (2013.01); *H01L 29/66545* (2013.01); *H01L 29/7833* (2013.01); *H01L 29/7851* (2013.01); *H01L 21/26513* (2013.01); *H01L 29/6656* (2013.01); *H01L 29/66636* (2013.01)

(56) References Cited

U.S. PATENT DOCUMENTS

| | | | |
|---|---|---|---|
| 9,171,929 | B2 | 10/2015 | Lee et al. |
| 9,214,555 | B2 | 12/2015 | Oxland et al. |
| 9,236,267 | B2 | 1/2016 | De et al. |
| 9,520,482 | B1 | 12/2016 | Chang et al. |
| 9,548,303 | B2 * | 1/2017 | Lee ................. H01L 21/823878 |
| 9,564,489 | B2 | 2/2017 | Yeo et al. |
| 9,570,580 | B1 * | 2/2017 | Chiang ............... H01L 27/0924 |
| 9,576,814 | B2 | 2/2017 | Wu et al. |
| 9,601,342 | B2 | 3/2017 | Lee et al. |
| 9,608,116 | B2 | 3/2017 | Ching et al. |
| 9,741,822 | B1 * | 8/2017 | Jagannathan ..... H01L 21/28238 |
| 9,960,083 | B1 * | 5/2018 | Chen ............... H01L 21/823807 |
| 10,332,981 | B1 * | 6/2019 | Lin ..................... H01L 29/0847 |
| 2007/0187767 | A1 * | 8/2007 | Yasutake ............. H01L 29/7848 257/368 |
| 2010/0081262 | A1 * | 4/2010 | Lim ................. H01L 21/823842 438/479 |
| 2013/0316504 | A1 * | 11/2013 | Cheng ............... H01L 21/823412 438/238 |
| 2015/0091086 | A1 * | 4/2015 | Lu ....................... H01L 29/7833 257/336 |
| 2015/0147861 | A1 * | 5/2015 | Park .................... H01L 29/0657 438/283 |
| 2015/0263003 | A1 * | 9/2015 | Lee ..................... H01L 27/1211 257/351 |
| 2015/0380528 | A1 * | 12/2015 | Lee .................. H01L 21/76224 438/283 |
| 2016/0086943 | A1 * | 3/2016 | Lee ....................... H01L 21/022 257/401 |
| 2016/0268312 | A1 * | 9/2016 | Wang ................ H01L 21/76264 |
| 2018/0026100 | A1 * | 1/2018 | Jagannathan ....... H01L 27/0886 257/401 |
| 2018/0122705 | A1 * | 5/2018 | Chen ............... H01L 21/823807 |
| 2018/0151378 | A1 * | 5/2018 | Huang ................ H01L 29/7851 |
| 2019/0035923 | A1 * | 1/2019 | Sadana ................ H01L 29/785 |
| 2019/0164846 | A1 * | 5/2019 | Leib ................... H01L 21/31144 |
| 2019/0280106 | A1 * | 9/2019 | Lin ..................... H01L 29/0847 |

OTHER PUBLICATIONS

Hashemi, Pouya, et al. "High Performance and Reliable Strained SiGe PMOS FinFETs Enabled by Advanced Gate Stack Engineering." 2017 IEEE International Electron Devices Meeting (IEDM), 2017, doi:10.1109/iedm.2017.8268510. (Year: 2017).*

Guo, D., et al. "FINFET Technology Featuring High Mobility SiGe Channel for 10nm and Beyond." 2016 IEEE Symposium on VLSI Technology, 2016, doi:10.1109/vIsit.2016.7573360. (Year: 2016).*

Ishii, Yohei, et al. "Anisotropic Selective Etching between SiGe and Si." Japanese Journal of Applied Physics, vol. 57, No. 6S2, 2018, doi:10.7567/jjap.57.06jc04. (Year: 2018).*

* cited by examiner

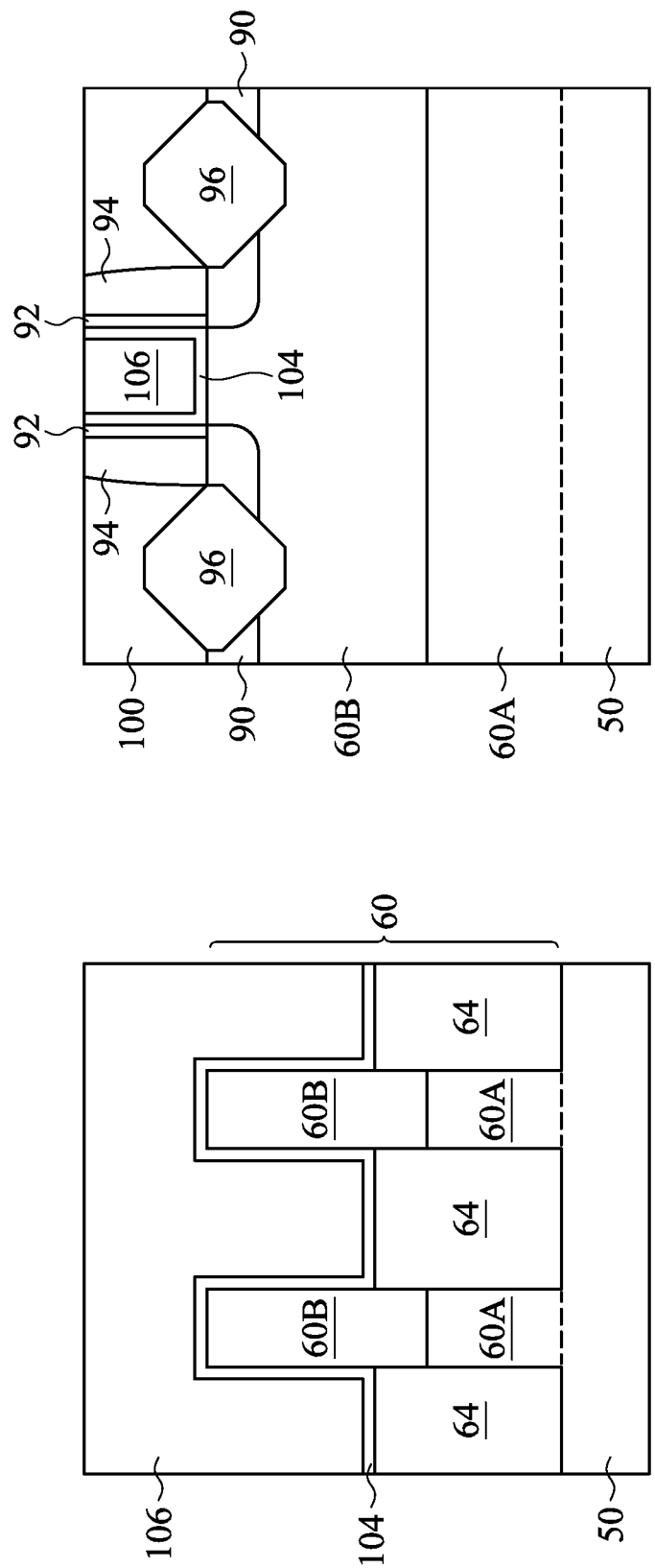

METHOD FOR INCREASING GERMANIUM CONCENTRATION OF FIN AND RESULTING SEMICONDUCTOR DEVICE

PRIORITY CLAIM

This application claims the benefit of U.S. Provisional Patent Application No. 62/692,018, filed on Jun. 29, 2018, which application is hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2, 3, 4, 5, 6, 7, 8, 9, 10A, 10B, 11A, 11B, 11C, 11D, 12A, 12B, 13A, 13B, 14A, 14B, 15, 16A, 16B, 17A, and 17B are cross-sectional views of intermediate stages in the manufacturing of FinFETs, in accordance with some embodiments.

DETAILED DESCRIPTION

Figure 1:
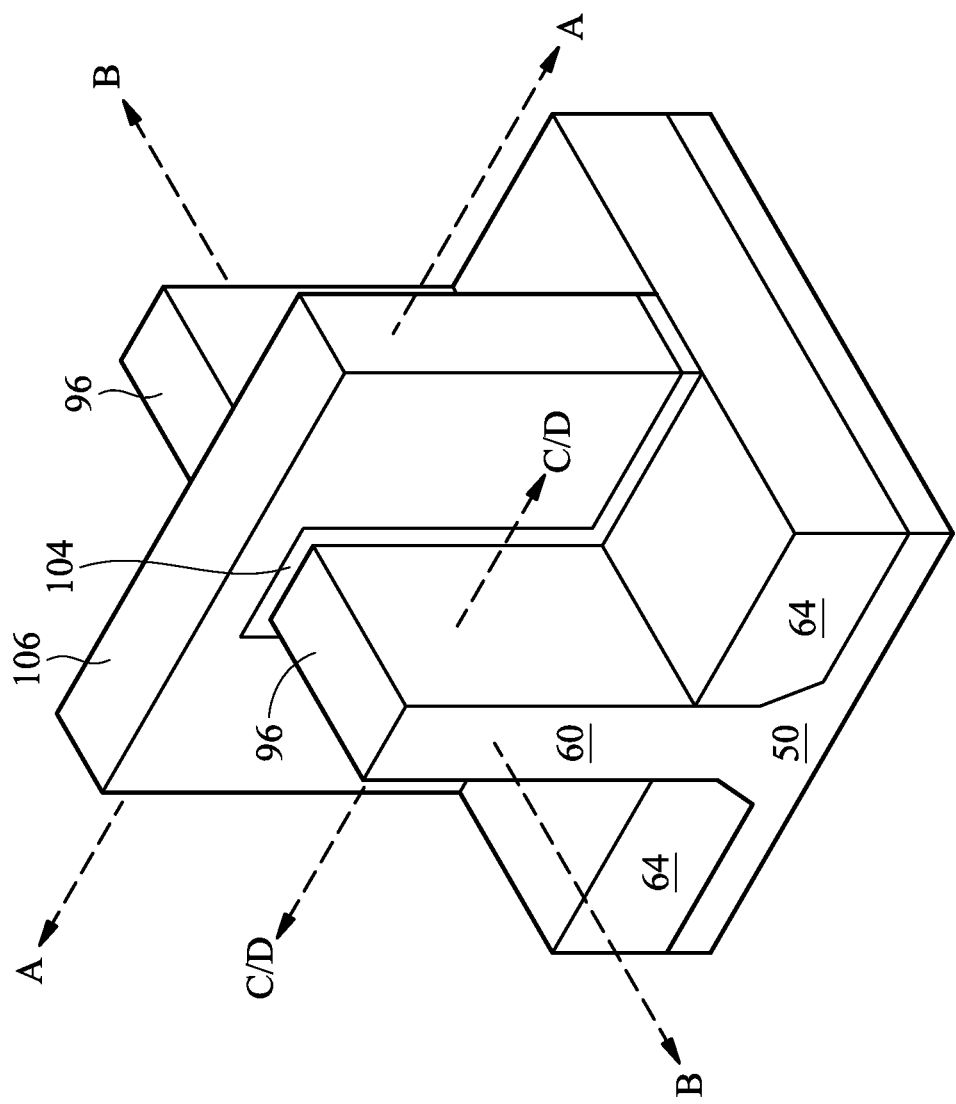
FIG. 1 illustrates an example of a Fin Field Effect Transistor (FinFET) in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

According to some embodiments, a substrate of a first semiconductor material (e.g., silicon) is provided, and a layer of a second semiconductor material (e.g., silicon germanium) is formed on the substrate. The second semiconductor material may have a low germanium concentration. Trenches are etched to form fins from the first and second semiconductor materials. A germanium condensation process is performed, which includes exposing the first and second semiconductor materials of the fins to a hydrogen radical. During the germanium condensation process, the germanium concentration along the sidewalls of the fins is increased. By condensing the germanium along the sidewalls of the fins, the germanium concentration in the channel regions of the fins may be increased. Because the fins are initially formed with a low germanium concentration, they have a lower amount of compressive strain, and thus deformation of the fins during trench etching may be reduced.

FIG. 1 illustrates an example of a FinFET in a three-dimensional view, in accordance with some embodiments. The FinFET comprises a fin 60 on a substrate 50. Shallow trench isolation (STI) regions 64 are formed on the substrate 50, and the fin 60 protrudes above and from between neighboring STI regions 64. A gate dielectric layer 104 is along sidewalls and over a top surface of the fin 60, and a gate electrode 106 is over the gate dielectric layer 104. Source/drain regions 96 are disposed in opposite sides of the fin 60 with respect to the gate dielectric layer 104 and gate electrode 106.

FIG. 1 further illustrates reference cross-sections that are used in later figures. Cross-section A-A is across a channel, gate dielectric layer 104, and gate electrode 106 of the FinFET. Cross-section B-B is perpendicular to cross-section A-A and is along a longitudinal axis of the fin 60 and in a direction of, for example, a current flow between the source/drain regions 96. Cross-section C/D-C/D is parallel to cross-section A-A and extends through a source/drain region 96 of the FinFET Subsequent figures refer to these reference cross-sections for clarity.

Some embodiments discussed herein are discussed in the context of FinFETs formed using a gate-last process. In other embodiments, a gate-first process may be used. Also, some embodiments contemplate aspects used in planar devices, such as planar FETs.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins.

FIGS. 2 through 17B are cross-sectional views of intermediate stages in the manufacturing of FinFETs, in accordance with some embodiments. FIGS. 2 through 9 are shown along reference cross-section A-A illustrated in FIG. 1 (except for multiple fins/FinFETs). In FIG. 10A through 17B, figures ending with an "A" designation are shown along reference cross-section A-A illustrated in FIG. 1 (except for multiple fins/FinFETs), figures ending with a "B" designation are shown along reference cross-section B-B illustrated in FIG. 1 (except for multiple fins/FinFETs), and figures ending with a "C" or "D" designation are shown along reference cross-section C/D-C/D illustrated in FIG. 1 (except for multiple fins/FinFETs).

Figure 2:
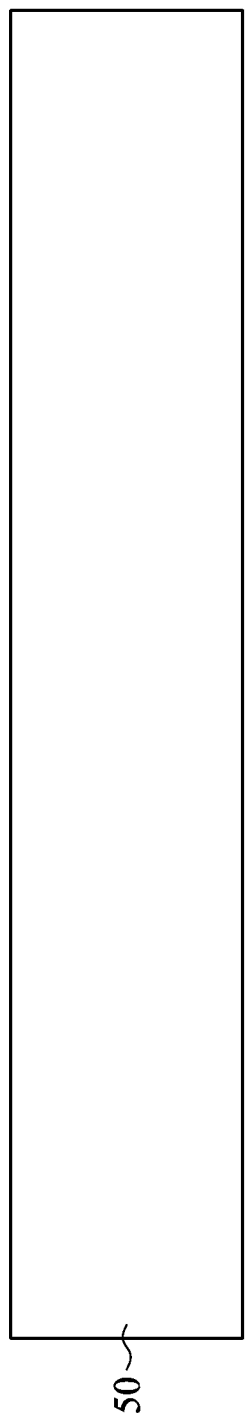

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the substrate 50 includes silicon, e.g., the substrate 50 is a silicon substrate such as a wafer. In some embodiments, the semiconductor material of the substrate 50 may also include germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

One region of the substrate 50 is illustrated. The illustrated region can be for forming n-type devices, such as NMOS transistors, e.g., n-type FinFETs, or for forming p-type devices, such as PMOS transistors, e.g., p-type FinFETs. Some embodiments discussed herein are discussed in the context of forming p-type devices in the illustrated region. N-type devices may be formed in other regions of the substrate 50. During processes for forming p-type devices, the regions for forming n-type devices may be covered by a mask such as a photoresist.

In some embodiments, the substrate 50 is doped to have appropriate doped regions (sometimes referred to as well regions). In embodiments where p-type devices are formed the illustrated region, an n-type doped region may be formed in the substrate 50. In some embodiment, the n-type doped region may be formed by implanting n-type impurities in the region of the substrate 50. In some embodiments, the substrate 50 may be provided pre-doped with n-type impurities. The n-type impurities may be phosphorus, arsenic, or the like, and may be formed in the region to a concentration of equal to or less than $10^{18}$ cm$^{-3}$, such as from about $10^{17}$ cm$^{-3}$ to about $10^{18}$ cm$^{-3}$. In embodiments where n-type devices are formed the illustrated region, a p-type doped region may be formed in the substrate 50. In some embodiment, the p-type doped region may be formed by implanting p-type impurities in the region of the substrate 50. In some embodiments, the substrate 50 may be provided pre-doped with p-type impurities. The p-type impurities may be boron, BF2, or the like, and may be formed in the region to a concentration of equal to or less than $10^{18}$ cm$^{-3}$, such as from about $10^{17}$ cm$^{-3}$ to about $10^{18}$ cm$^{-3}$.

Figure 3:
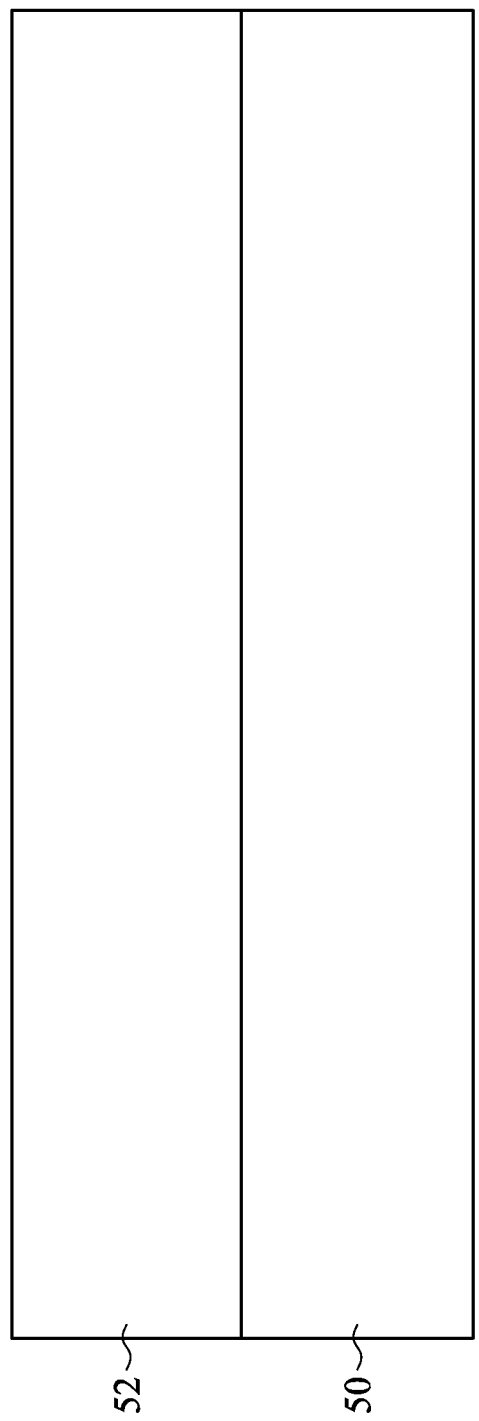

In FIG. 3, a semiconductor layer 52 is formed on the substrate 50. The semiconductor layer 52 may be epitaxially grown on the substrate 50. In embodiments where p-type devices are formed, the semiconductor layer 52 is a semiconductor material including germanium, such as silicon germanium ($Si_xGe_{1-x}$, where x can be in the range of 0 to 1). Silicon and silicon germanium have different lattice constants. As such, the semiconductor layer 52 and substrate 50 have mismatched lattice constants. The lattice constant mismatch depends on the germanium concentration in the semiconductor layer 52, where a higher germanium concentration results in a greater lattice constant mismatch. The lattice constant mismatch induces a compressive strain in the semiconductor layer 52, which may increase the carrier mobility of the semiconductor layer 52, which may improve the channel region mobility of subsequently formed p-type devices. Because the germanium concentration of the semiconductor layer 52 is low, the lattice constant mismatch and amount of compressive strain is also low.

In some embodiments, the semiconductor layer 52 is in situ doped during growth to have appropriate doped regions (sometimes referred to as well regions). The doped regions of the semiconductor layer 52 may be of the same doping type as the underlying doped regions of the substrate 50. The doped regions of the semiconductor layer 52 may have the same doping concentration as the underlying doped regions of the substrate 50, or may have a different doping concentration.

Figure 4:
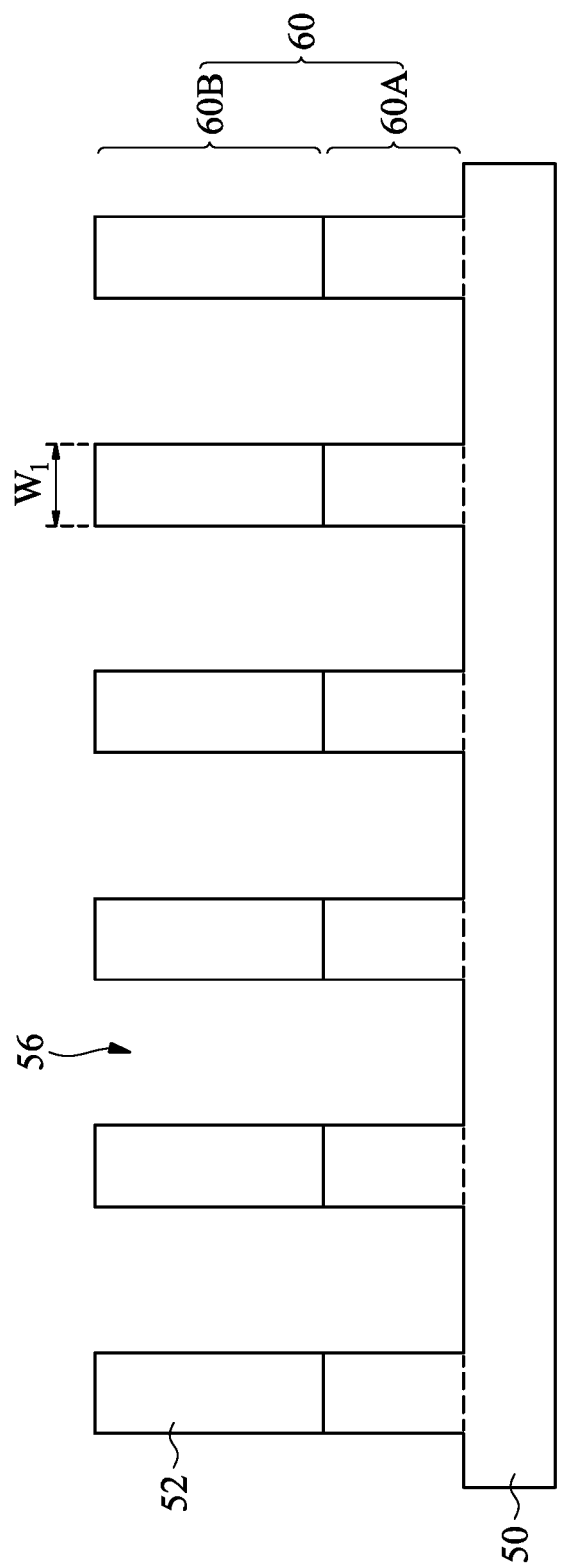

In FIG. 4, trenches 56 are formed in the semiconductor layer 52 (and optionally the substrate 50). The trenches 56 may be formed by one or more etching process(es), using a photoresist as an etching mask. The etching process(es) may include a wet etch, a dry etch, a reactive ion etch (RIE), a neutral beam etch (NBE), a combination thereof, or the like, and may be anisotropic. The trenches 56 may extend partially into the semiconductor layer 52, or may extend through the semiconductor layer 52 and into the substrate 50. Portions of the semiconductor layer 52 (and optionally the substrate 50) remaining between the trenches 56 are referred to as fins 60. The fins 60 include a first portion 60A comprising portions of the substrate 50 (e.g., a first layer of a first semiconductor material), and a second portion 60B comprising portions of the semiconductor layer 52 (e.g., a second layer of a second semiconductor material). The fins 60 are initially formed to a first width $W_1$. In some embodiments, the first width $W_1$ is from about 7 nm to about 15 nm. Such a fin width may allow the fin to retain a sufficient thickness after sides of the fins are etched (described below). It should be appreciated that the fins 60 may be formed other ways. For example, a patterned mask (such as a photoresist, a hardmask, or the like) may be formed over the substrate 50, and epitaxial regions corresponding to the fins 60 may be grown in the openings of the patterned mask.

The fins 60 are semiconductor strips. When the semiconductor layer 52 is etched to form the second portions 60B of the fins 60, sidewalls of the fins 60 are exposed and have no lateral constraints, e.g., are exposed to free space and are not supported by other structures or materials. As noted above, the semiconductor layer 52 is strained. Because sidewalls of the fins 60 are unconstrained during the etching, the strain in the semiconductor layer 52 is released during the etching. The shape of the semiconductor material may change when the strain is released, deforming the fins 60 such that they do not have a desired fin shape. In particular, the fins 60 may deform such that the semiconductor strips are not straight strips in a top-down view. The deformed fins 60 may bend or curve as they extend along the substrate 50. The amount of deformity of the fins 60 depends on the amount of strain released from the semiconductor layer 52. The risk of fin deformity may be exacerbated when the fins 60 are formed with narrower widths or greater heights. Excessive deformation may decrease the yield of the fins 60, and may also decrease the carrier mobility of the fins 60. The semiconductor layer 52 may be formed with a low initial germanium concentration. Because the semiconductor layer 52 is formed with a low germanium concentration, the amount of strain released is low. In some embodiments, the initial germanium concentration may be in the range of from about 15% to about 40%, which may provide sufficient channel mobility without causing significant deformation. By forming the semiconductor layer 52 with a low initial germanium concentration, the carrier mobility gained by avoiding fin deformation may be greater than the carrier mobility lost by reducing germanium concentration.

Figure 5:
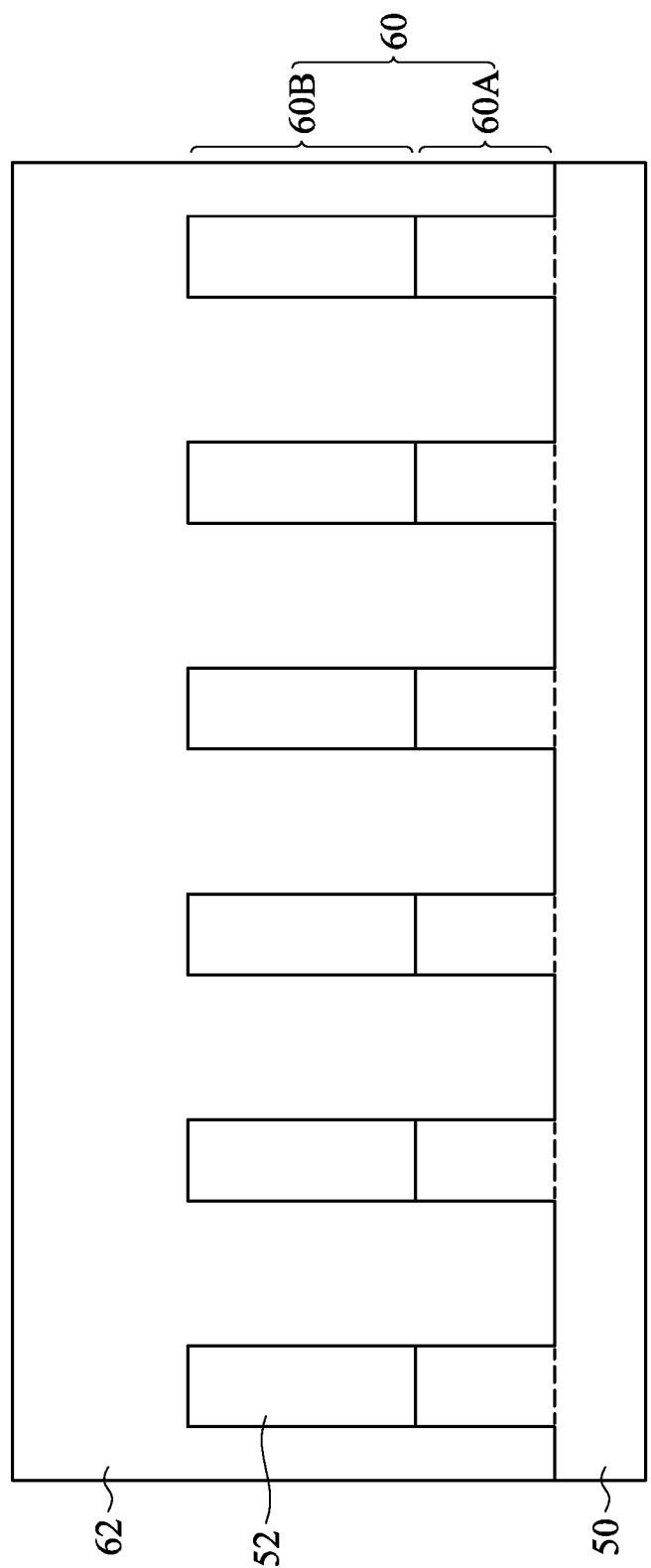

In FIG. 5, an insulation material 62 is formed over the substrate 50 and between neighboring fins 60. The insulation material 62 may be formed such that excess portions of the insulation material 62 cover the fins 60. The insulation material 62 may be an oxide, such as silicon oxide, a nitride, the like, or a combination thereof, and may be formed by a high density plasma chemical vapor deposition (HDP-CVD), a flowable chemical vapor deposition (FCVD) (e.g., a chemical vapor deposition (CVD) based material deposition in a remote plasma system and post curing to make it convert to another material, such as an oxide), the like, or a combination thereof. Other insulation materials formed by any acceptable process may be used. In the illustrated embodiment, the insulation material 62 is silicon oxide formed by a FCVD process. An anneal process may be performed once the insulation material is formed.

Figure 6:
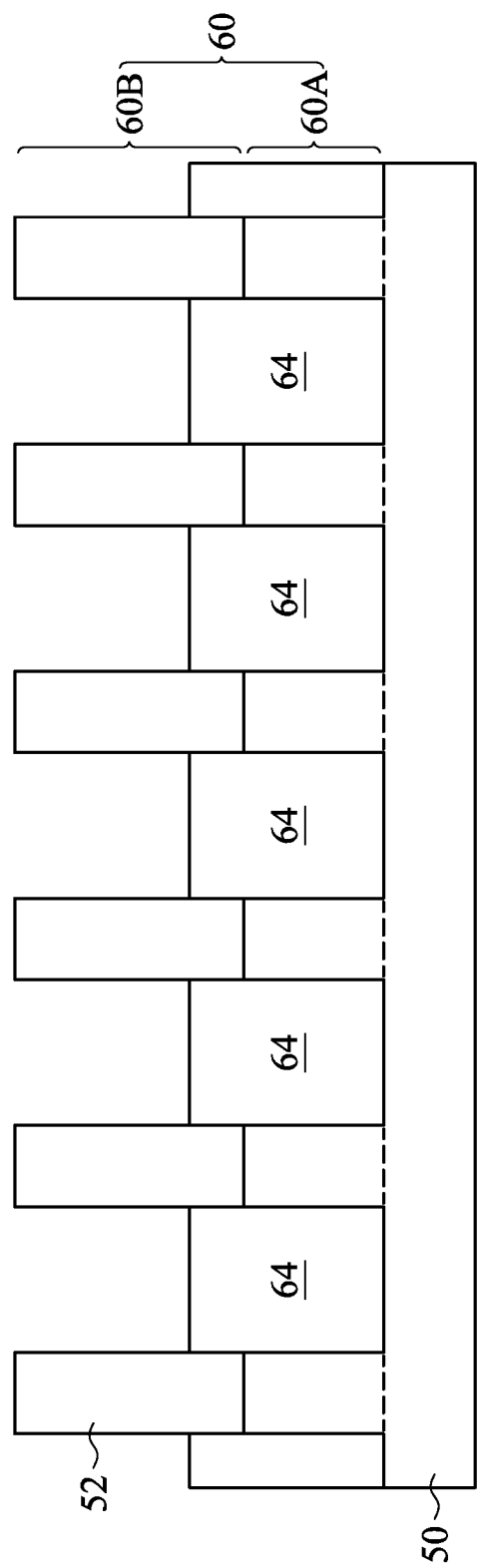

In FIG. 6, the insulation material 62 is recessed to form STI regions 64. The insulation material 62 is recessed such that the second portions 60B of the fins 60 protrude from between neighboring STI regions 64. The insulation material 62 may be recessed by performing a planarization process followed by an acceptable etching process. In some embodiments, the planarization process includes a chemical mechanical polish (CMP), an etch back process, combinations thereof, or the like. The planarization process exposes the fins 60. Top surfaces of the fins 60 and the insulation material 62 are level after the planarization process. The STI regions 64 may then be recessed using an acceptable etching process, such as one that is selective to the material of the insulation material 62. For example, a chemical oxide removal using a hydrogen source (e.g., ammonia) with a fluorine source (e.g., nitrogen trifluoride), or a chemical oxide removal using dilute hydrofluoric (dHF) acid may be used. The top surfaces of the STI regions 64 may be formed flat, convex, and/or concave by the etching process.

Figure 7:
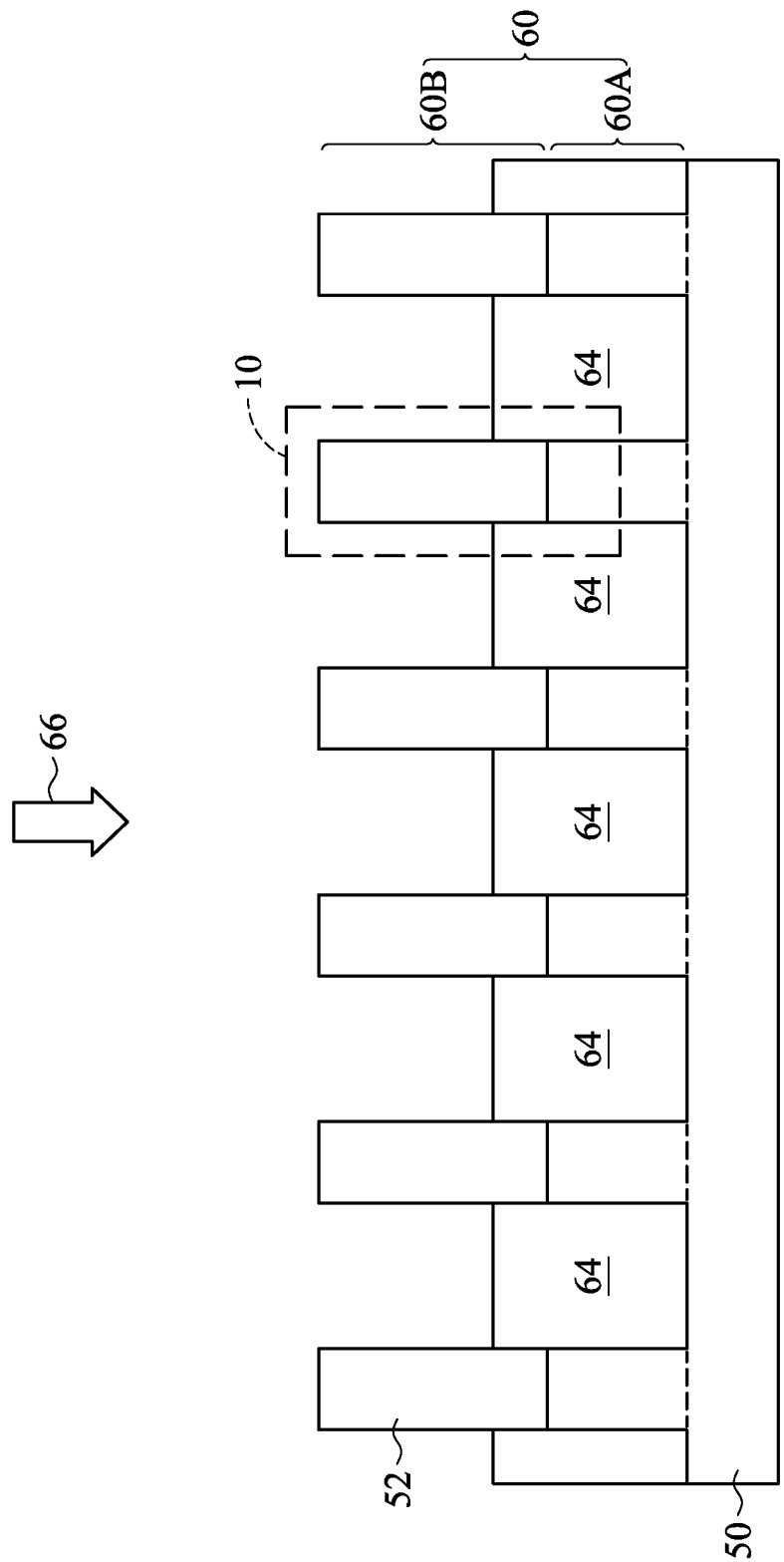
Figure 8:
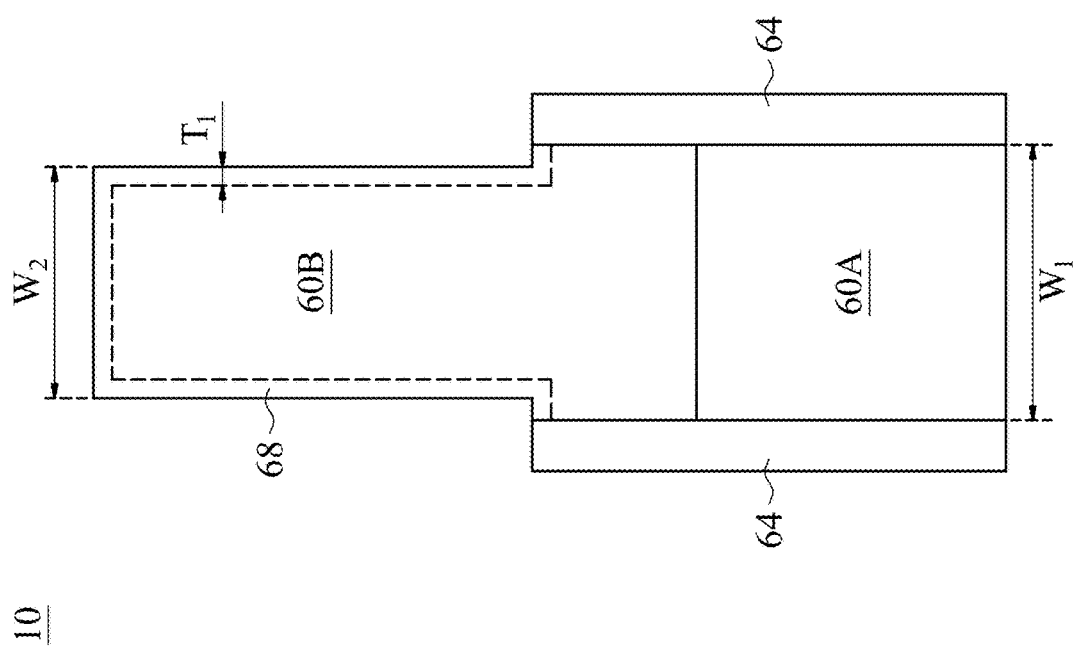

In FIG. 7, a germanium condensation process 66 is performed on the fins 60. FIG. 8 is a detailed view of a region 10 in FIG. 7, showing additional features of a fin 60 after the germanium condensation process 66. The germanium condensation process 66 forms germanium-rich layers 68 in the second portions 60B of the fins 60. The resulting germanium-rich layers 68 are in sidewalls of the second portions 60B of the fins 60. As such, edge portions of the second portions 60B of the fins 60 have a higher germanium concentration than center portions of the second portions 60B of the fins 60. The edge portions include sides and top surfaces of the second portions 60B of the fins 60. In some embodiments, the germanium-rich layers 68 in the second portions 60B of the fins 60 may have a germanium concentration of from about 20% to about 45%, which may improve the carrier mobility of resulting FinFETs. In some embodiments, the germanium condensation process 66 increases the germanium concentration of the fin 60 at the germanium-rich layers 68 by as much as 4%. In one device, the germanium concentration of a fin 60 was increased from about 29% throughout before treatment, to about 29% in the center portions of the fin 60 and about 35% at the edge portions of the fin 60 after treatment.

The germanium condensation process 66 is a hydrogen radical treatment process, in which surfaces of the second portions 60B of the fins 60 are exposed to hydrogen radicals. Hydrogen radicals readily react with Group IV materials to form tetrahydride compounds. The hydrogen radical treatment process may be performed in a chamber such as an etch chamber. A gas source is dispensed in the etch chamber. The gas source includes a precursor gas and an inert gas. The precursor gas comprises $H_2$, and the inert gas may comprise Ar, He, or a combination thereof, although other inert gasses such as Xe, Ne, Kr, Rn, the like, or combinations thereof may be used. In some embodiments, the precursor gas is from about 3% to about 20% of the gas source, and the carrier gas is from about 80% to about 97% of the gas source. The gas source may be dispensed at a flow rate of from about 10 standard cubic centimeters per minute (sccm) to about 5000 sccm. When the gasses are dispensed, a plasma is generated from the $H_2$, Ar, and/or He. The plasma may be generated in a plasma generation process by a plasma generator such as a transformer-coupled plasma generator, inductively coupled plasma system, magnetically enhanced reactive ion etching system, electron cyclotron resonance system, remote plasma generator, or the like. The plasma generator generates radio frequency power that produces a plasma from the $H_2$, Ar, and/or He, e.g., by applying a voltage above the striking voltage to electrodes in a chamber containing Ar, He, Ar and $H_2$, or He and $H_2$. When the plasma is generated, the $H_2$ is split into 2H. When exposed to the hydrogen plasma, the silicon germanium material at the surface of the second portions 60B of the fins 60 breaks apart and recombines with the free H. to form silane ($SiH_4$) and germane ($GeH_4$), thus removing the material at the surfaces of the fins 60. The result silane and germane are gasses that may be removed from the etch chamber during their formation by, e.g., vacuuming. The reaction rate between silicon and hydrogen is greater than the reaction rate between germanium and hydrogen. For example, the reaction rate between silicon and hydrogen is from about 2 to about 10 times the reaction rate between germanium and hydrogen. It should be appreciated that the difference in reaction rates may vary based on processing parameters and the initial germanium concentration. Hydrogen is more easily desorbed from germanium surfaces than silicon surfaces, and so silicon at the surfaces of the fins 60 is removed faster than germanium at the surfaces of the fins 60. As such, after the germanium condensation process 66, the silicon concentration at the surfaces of the fins 60 is decreased, and the germanium concentration at the surfaces of the fins 60 is increased. In some embodiments, the hydrogen radical treatment process is performed at a temperature of from about 100° C. to about 600° C., for a time span of less than about 100 seconds (such as less than about 50 seconds) and at a pressure of from about 0.1 Torr to about 6 Torr. Advantageously, the hydrogen radical treatment process may be performed at such lower temperatures, shorter time periods, and lower pressures than other germanium condensation processes such as thermal oxidation processes. Such improved processing parameters may improve manufacturing speeds and decrease thermal budget concerns.

Because the hydrogen radical treatment process removes some material at the surfaces of the fins 60 to form silane and germane, it also performs some etching of the fins 60. As such, after germanium condensation, upper portions of the fins 60 have a second width $W_2$, which is less than the first width $W_1$ of lower portions of the fins 60. Further, when the second portions 60B of the fins 60 extend between neighboring STI regions 64, the second portions 60B of the fins 60 may have different upper and lower widths. The width reduction of the fins 60 depends on the parameters of the germanium condensation process 66. In some embodiments, the second width $W_2$ is in the range of from about 7 nm to about 15 nm. The thickness of the germanium-rich layers 68 also depends on the parameters of the germanium condensation process 66. By varying the parameters of the germanium condensation process 66, the thickness $T_1$ of the germanium-rich layers 68 may be varied from a few monolayers to substantially the entire width of the fins 60. In some embodiments, the thickness $T_1$ is less than about 2 nm, such as in the range of from about 0.5 nm to about 1 nm, which may result in an increased hole mobility. When more germanium condensation is performed, the thickness $T_1$ of the germanium-rich layers 68 is increased, the germanium concentration of the germanium-rich layers 68 is increased, and the second width $W_2$ of the fins 60 is decreased.

Although the germanium-rich layers 68 are shown as being discrete regions of the fins 60, it should be appreciated that the germanium-rich layers 68 comprise the same elements as the second portions 60B of the fins 60, albeit with a greater germanium concentration. Further, it should be appreciated that the germanium concentration of the fins 60 may gradually increase in a direction extending from center portions of the fins 60 to edge portions of the fins 60.

Although the semiconductor layer 52 is formed with a low germanium concentration, forming the germanium-rich layers 68 allows the germanium concentration of the fins 60 to be increased. Forming the fins 60 with a low initial germanium concentration may help avoid deformation of the fins 60 during formation, and also may help improve the crystalline quality of the semiconductor layer 52. Increasing the germanium concentration of the fins 60 after formation may allow the carrier mobility of the fins 60 to be increased without the downside of increased fin deformation. Further, because the germanium-rich layers 68 are near the sidewalls of the fins 60, they may be close to the gates of the subsequently formed p-type devices, allowing the channel region mobility of the subsequently formed p-type devices to be increased. The final strain of the fins 60 may also be higher than the initial strain of the fins 60.

Figure 9:
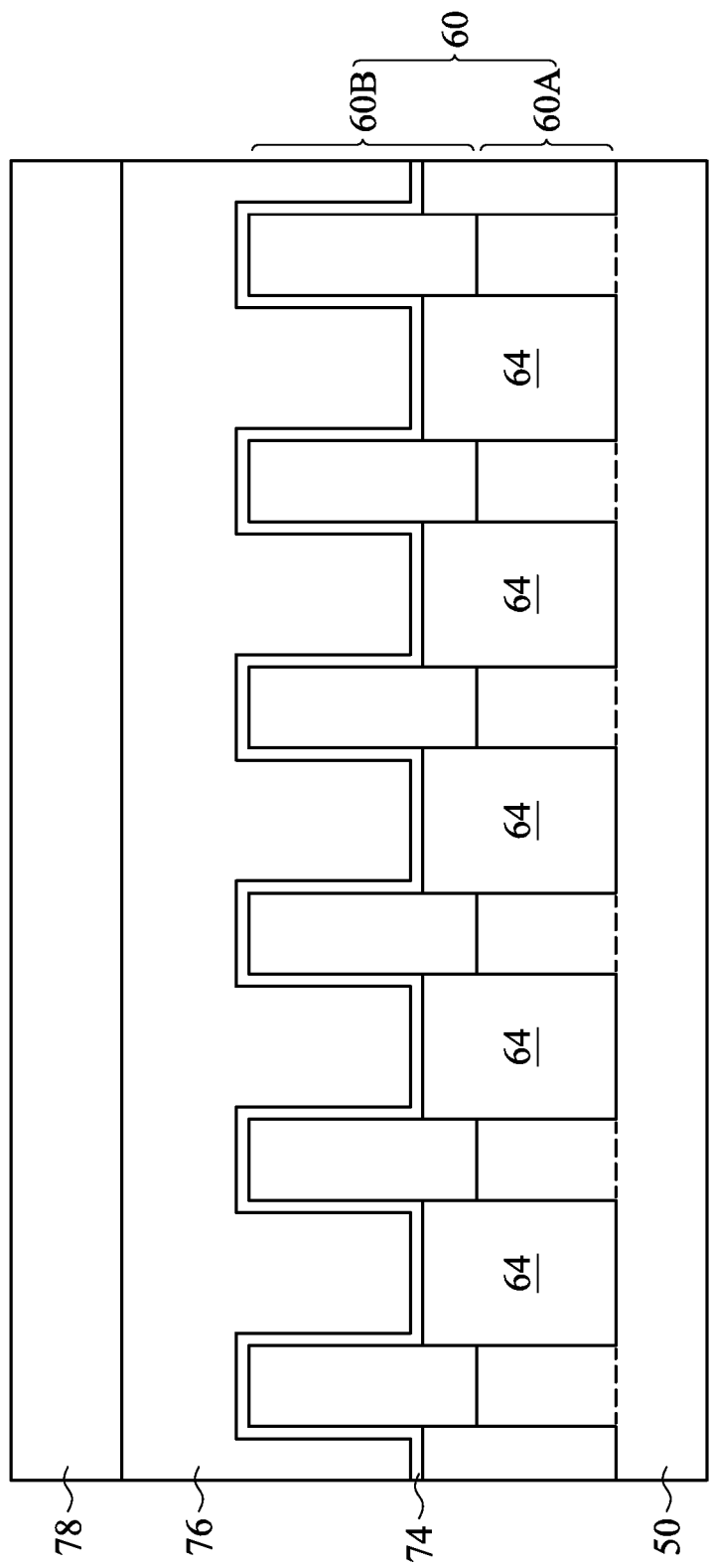

In FIG. 9, a dummy dielectric layer 74 is formed over the fins 60, such as the second portions 60B of the fins 60. The dummy dielectric layer 74 may be, for example, silicon oxide, silicon nitride, a combination thereof, or the like, and may be deposited or thermally grown according to acceptable techniques. A dummy gate layer 76 is formed over the dummy dielectric layer 74, and a mask layer 78 is formed over the dummy gate layer 76. The dummy gate layer 76 may be deposited over the dummy dielectric layer 74 and then planarized, such as by a CMP. The dummy gate layer 76 may be a conductive material and may be selected from a group including polycrystalline-silicon (polysilicon), polycrystalline silicon-germanium (poly-SiGe), metallic nitrides, metallic silicides, metallic oxides, and metals. In one embodiment, amorphous silicon is deposited and recrystallized to create polysilicon. The dummy gate layer 76 may be deposited by physical vapor deposition (PVD), CVD, sputter deposition, or other techniques known and used in the art for depositing conductive materials. The dummy gate layer 76 may be made of other materials that have a high etching selectivity from the etching of isolation regions. The mask layer 78 may be deposited over the dummy gate layer 76.

Figure 10B:
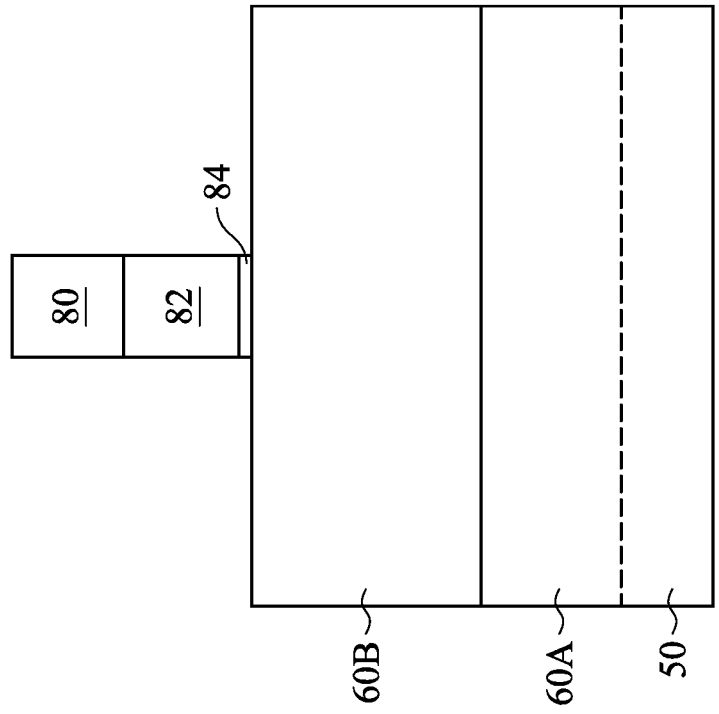
Figure 10A:
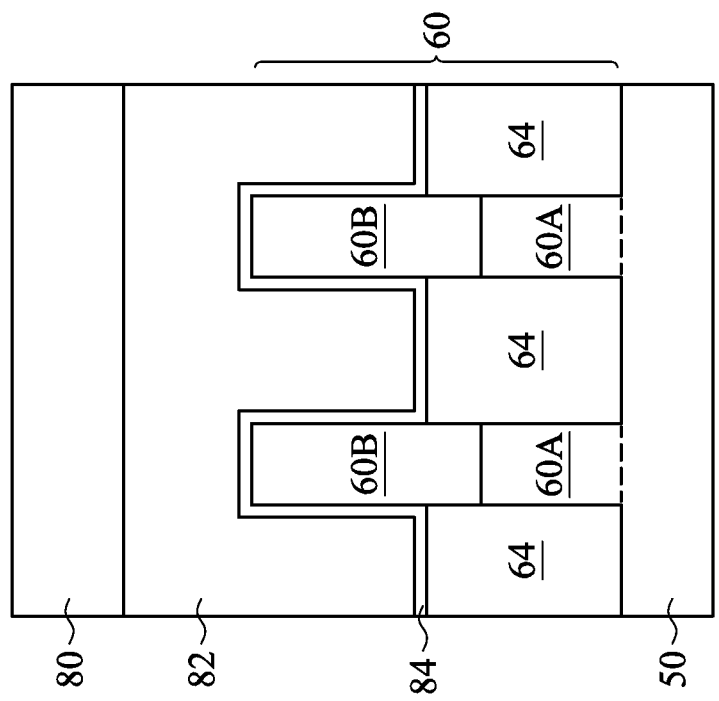

In FIGS. 10A and 10B, the mask layer 78 is patterned using acceptable photolithography and etching techniques to form masks 80. The pattern of the masks 80 then may be transferred to the dummy gate layer 76 and the dummy dielectric layer 74 by an acceptable etching technique to, respectively, form dummy gates 82 and dummy gate dielectric layers 84. The dummy gates 82 and dummy gate dielectric layers 84 cover respective channel regions of the fins 60. The pattern of the masks 80 may be used to physically separate each of the dummy gates 82 from adjacent dummy gates. The dummy gates 82 may also have a lengthwise direction substantially perpendicular to the lengthwise direction of respective ones of the fins 60.

In FIGS. 11A, 11B, 11C, and 11D, implants for lightly doped source/drain (LDD) regions 90 may be performed. Appropriate type (e.g., n-type or p-type) impurities may be implanted into the exposed fins 60. The n-type impurities may be the any of the n-type impurities previously discussed, and the p-type impurities may be the any of the p-type impurities previously discussed. The lightly doped source/drain regions may have a concentration of impurities of from about $10^{15}$ cm$^{-3}$ to about $10^{16}$ cm$^{-3}$. An anneal may be used to activate the implanted impurities.

Further, gate seal spacers 92 can be formed on exposed surfaces of the dummy gates 82 and/or the fins 60. A thermal oxidation or a deposition followed by an anisotropic etch may form the gate seal spacers 92. In some embodiments, the gate seal spacer may be formed of a nitride, such as silicon nitride, silicon oxynitride, silicon carbide, silicon carbonitride, the like, or a combination thereof. The gate seal spacers 92 seal the sidewalls of subsequently formed gate stacks, and may act as additional gate spacing layers.

Further, gate spacers 94 are formed on the gate seal spacers 92 along sidewalls of the dummy gates 82 and over the LDD regions 90. The gate spacers 94 may be formed by conformally depositing a material and subsequently anisotropically etching the material. The material of the gate spacers 94 may be silicon nitride, SiCN, a combination thereof, or the like. The etch may be selective to the material of the material of the gate spacers 94, such that the LDD regions 90 are not etched during the formation of the gate spacers 94.

Further, epitaxial source/drain regions 96 are formed in the fins 60. The epitaxial source/drain regions 96 are formed in the fins 60 such that each dummy gate 82 is disposed between respective neighboring pairs of the epitaxial source/drain regions 96. In some embodiments, the epitaxial source/drain regions 96 may extend through the LDD regions 90. In some embodiments, the gate seal spacers 92 and gate spacers 94 are used to separate the epitaxial source/drain regions 96 from the dummy gates 82 by an appropriate lateral distance so that the epitaxial source/drain regions 96 do not short out subsequently formed gates of the resulting FinFETs.

The epitaxial source/drain regions 96 may be formed by etching source/drain regions of the fins 60 to form recesses in the fins 60. The recesses may be confined to the second portions 60B of the fins 60, or may also extend into the first portions 60A of the fins 60. Then, the epitaxial source/drain regions 96 are epitaxially grown in the recesses. The epitaxial source/drain regions 96 may include any acceptable material, such as appropriate for p-type or n-type FinFETs. For example, in embodiments where p-type devices are formed, the epitaxial source/drain regions 96 may comprise SiGe, SiGeB, Ge, GeSn, or the like. The epitaxial source/drain regions 96 may also have surfaces raised from respective surfaces of the fins 60 and may have facets.

The epitaxial source/drain regions 96 are in situ doped during growth to form source/drain regions. The epitaxial source/drain regions 96 have the same doping type as the respective LDD regions 90, and may be doped with the same dopants or different dopants. The epitaxial source/drain regions 96 may have an impurity concentration of between about $10^{19}$ cm$^{-3}$ and about $10^{21}$ cm$^{-3}$. The n-type and/or p-type impurities for source/drain regions may be any of the impurities previously discussed. Because the epitaxial source/drain regions 96 are in situ doped during growth, they are not doped by implantation. However, the doping profile and concentration of the LDD regions 90 produced according to some embodiments may be similar to that which would be produced if the epitaxial source/drain regions 96 were doped by implantation. Improving the doping profile and concentration of the LDD regions 90 may improve the performance and reliability of the resulting semiconductor devices.

Figure 11B:
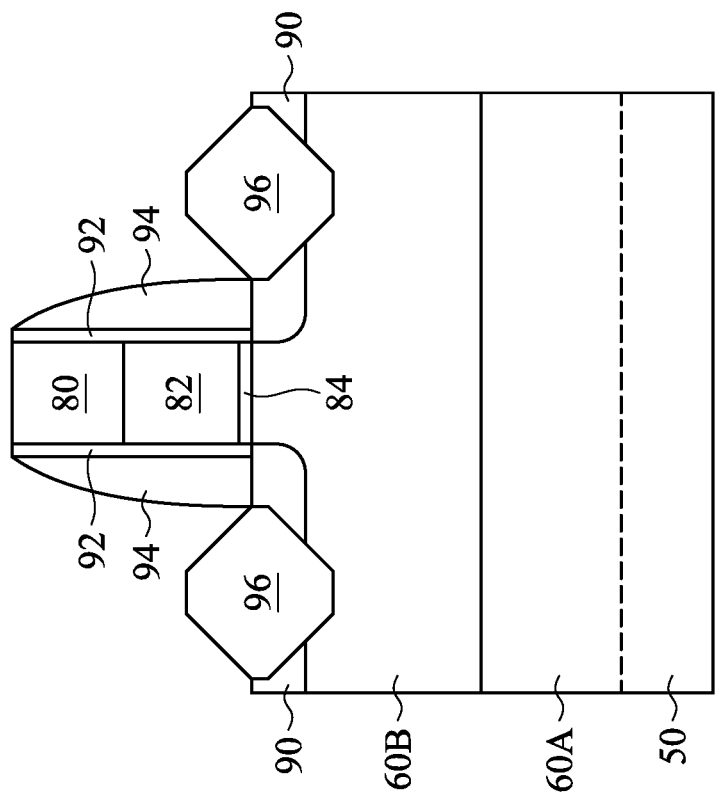
Figure 11A:
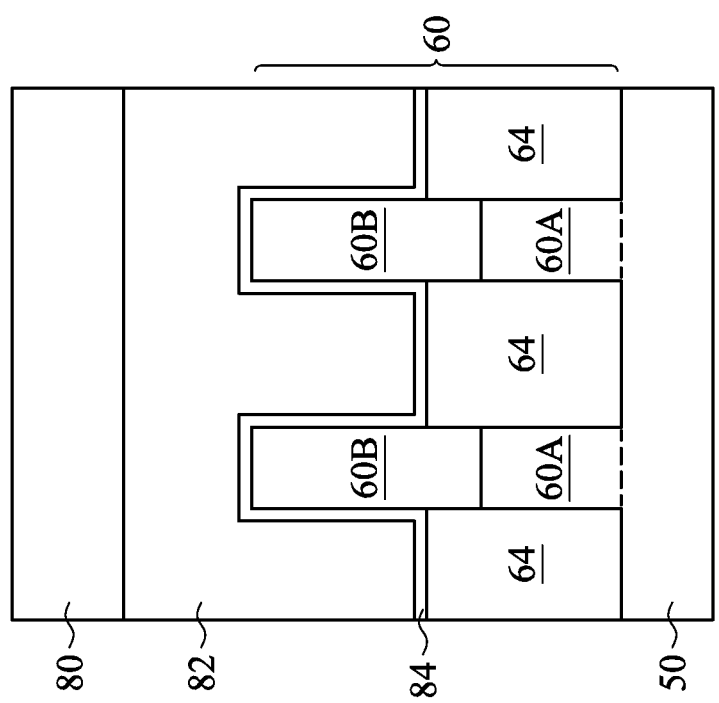
Figure 11C:
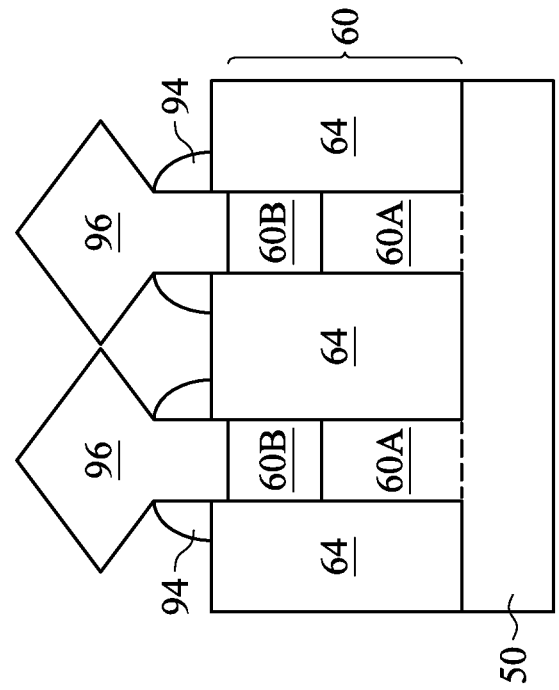
Figure 11D:
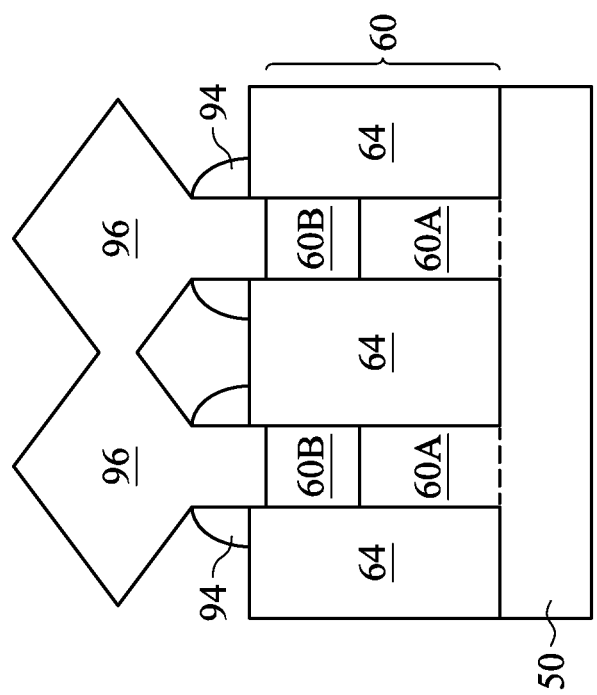

As a result of the epitaxy processes used to form the epitaxial source/drain regions 96, upper surfaces of the epitaxial source/drain regions have facets which expand laterally outward beyond a sidewalls of the fins 60. In some embodiments, these facets cause adjacent epitaxial source/drain regions 96 of a same finFET to merge, as illustrated by the embodiment of FIG. 11C. In other embodiments, adjacent epitaxial source/drain regions 96 remain separated after the epitaxy process is completed, as illustrated by the embodiment of FIG. 11D.

Figure 12B:
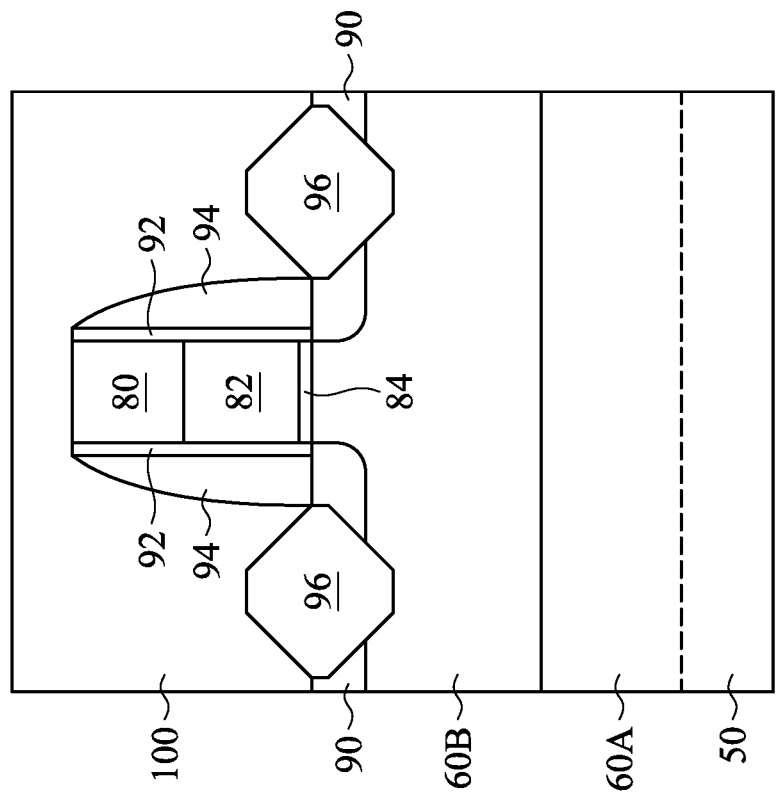
Figure 12A:
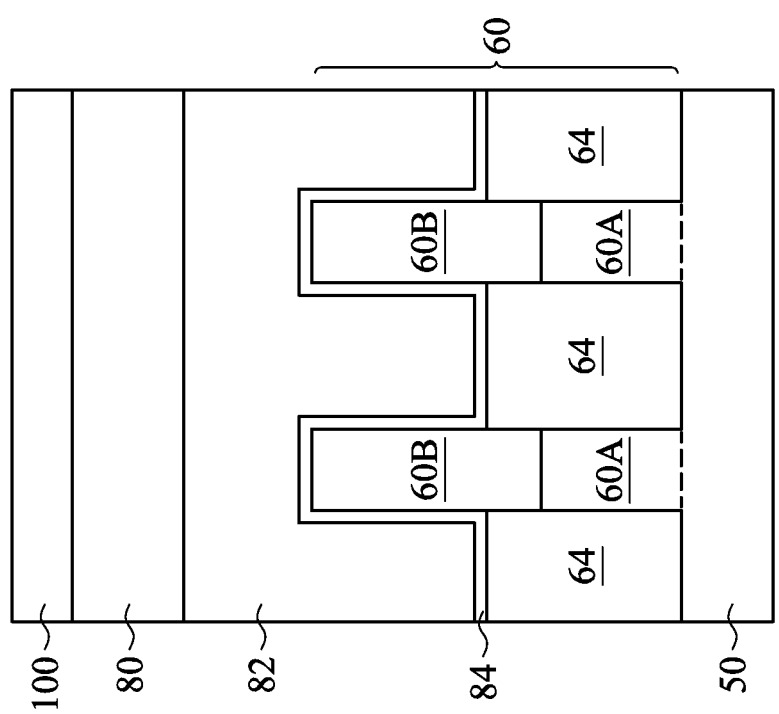

In FIGS. 12A and 12B, an inter-layer dielectric (ILD) 100 is deposited over the fins 60. The ILD 100 may be formed of a dielectric material, and may be deposited by any suitable method, such as CVD, plasma-enhanced CVD (PECVD), or FCVD. Dielectric materials may include Phospho-Silicate Glass (PSG), Boro-Silicate Glass (BSG), Boron-Doped Phospho-Silicate Glass (BPSG), undoped Silicate Glass (USG), or the like. Other insulation materials formed by any acceptable process may be used. In some embodiments, a contact etch stop layer (CESL) is disposed between the ILD 100 and the epitaxial source/drain regions 96, the gate spacers 94, the gate seal spacers 92, and the masks 80.

Figures 13A, 13B:
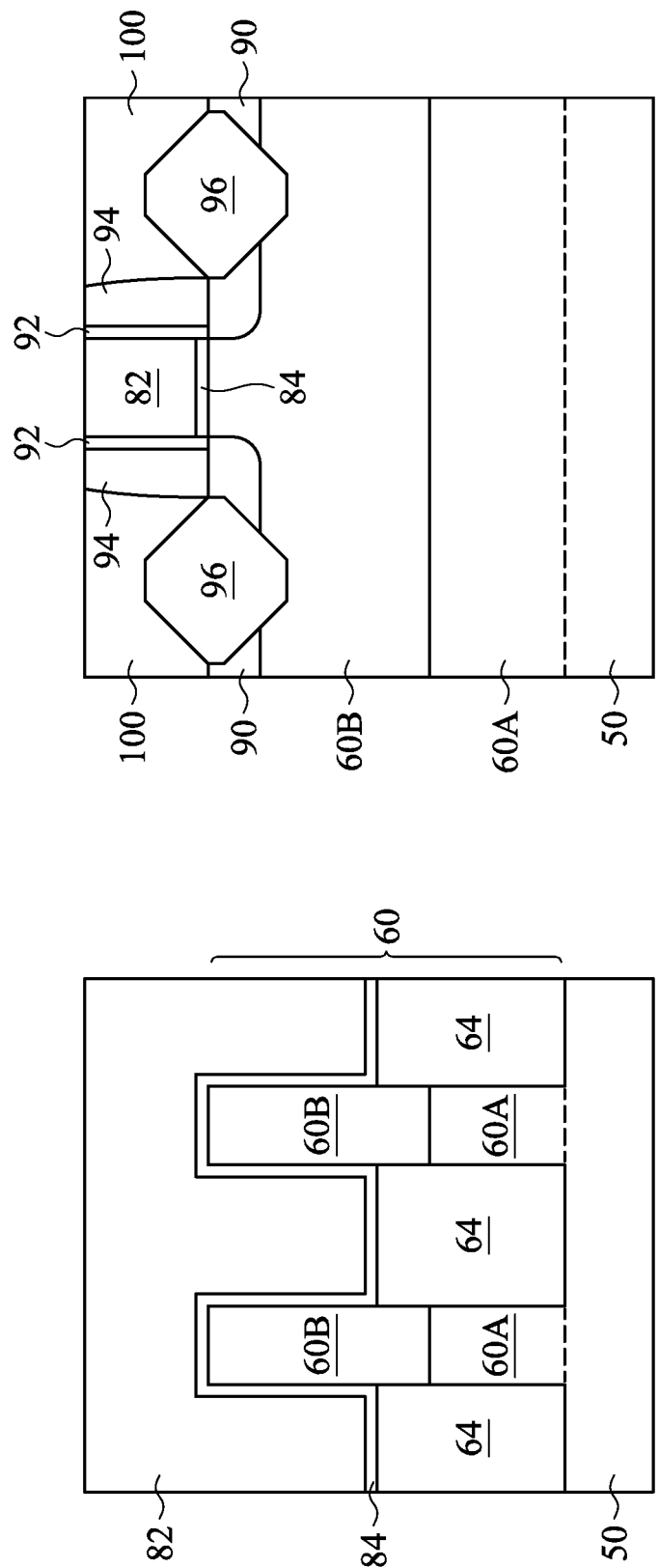

In FIGS. 13A and 13B, a planarization process, such as a CMP, may be performed to level the top surface of the ILD 100 with the top surfaces of the dummy gates 82 and gate seal spacers 92. The planarization process may also remove the masks 80 on the dummy gates 82, and portions of the gate seal spacers 92 and the gate spacers 94 along sidewalls of the masks 80. After the planarization process, top surfaces of the dummy gates 82, the gate seal spacers 92, the gate spacers 94, and the ILD 100 are level. Accordingly, the top surfaces of the dummy gates 82 are exposed through the ILD 100.

Figure 14B:
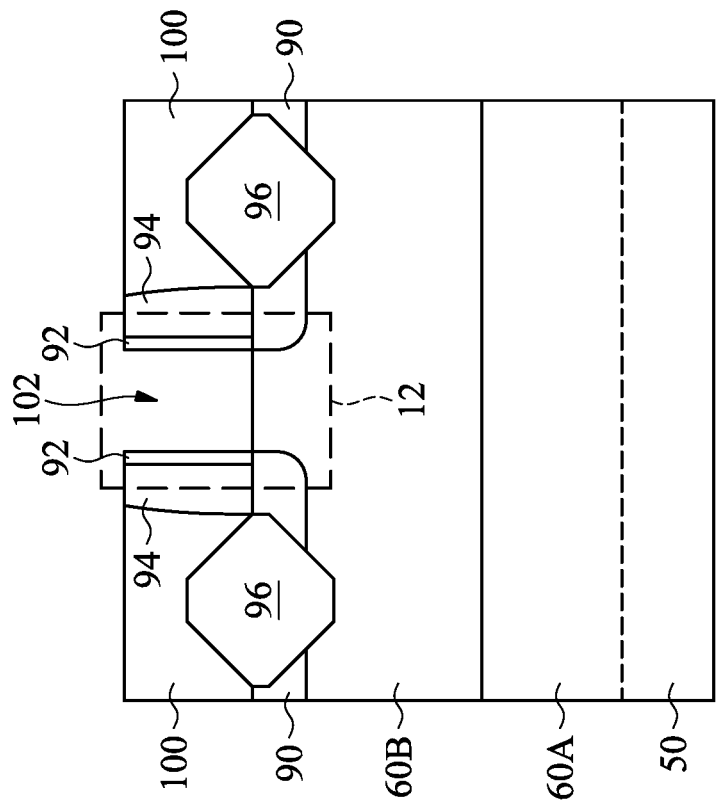
Figure 14A:
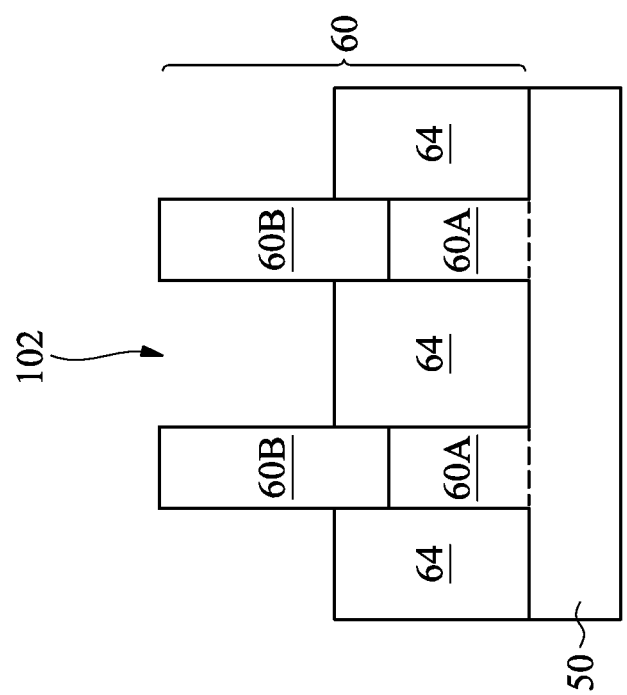

In FIGS. 14A and 14B, the dummy gates 82 and portions of the dummy gate dielectric layers 84 directly underlying the exposed dummy gates 82 are removed in an etching step(s), so that recesses 102 are formed. In some embodiments, the dummy gates 82 are removed by an anisotropic dry etch process that does not remove the material(s) of the gate seal spacers 92 or ILD 100. For example, the etching process may include a dry etch process using reaction gas(es) that selectively etch the dummy gates 82 without etching the ILD 100 or the gate spacers 94. Each recess 102 exposes a channel region of a respective fin 60. Each channel region may be confined to the second portion 60B of the respective fin 60. Each channel region is disposed between neighboring pairs of the epitaxial source/drain regions 96. During the removal, the dummy gate dielectric layers 84 may be used as an etch stop layer when the dummy gates 82 are etched. The dummy gate dielectric layers 84 may then be removed after the removal of the dummy gates 82.

Figure 15:
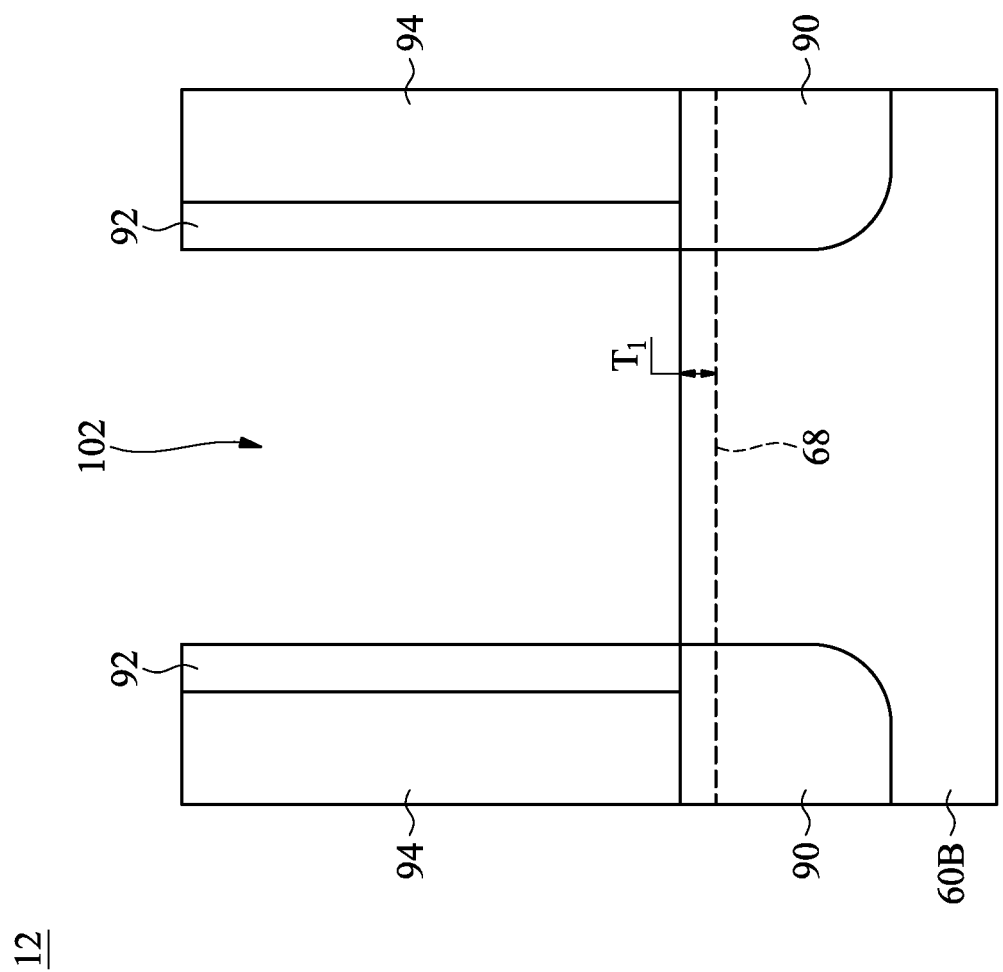

FIG. 15 is a detailed view of a region 12 in FIG. 14B, showing additional features of a fin 60 after the recesses 102 are formed. The germanium-rich layers 68 are across what will be channel regions of the resulting FinFETs, and extend between the LDD regions 90. The LDD regions 90 are also formed in portions of the fins 60 having the germanium-rich layers 68. As such, upper portions of the LDD regions 90 may have a higher germanium concentration than lower portions of the LDD regions 90. The thickness $T_1$ of the germanium-rich layers 68 (discussed above) may be uniform in the LDD regions 90 and the channel regions.

In FIGS. 16A and 16B, gate dielectric layers 104 and gate electrodes 106 are formed in the recesses 102. An interface layer is conformally formed over the fin 60 and in the recesses 102. The interface layer may also cover the upper surface of the ILD 100. The interface layer may be formed by a deposition process, such as a CVD process, a physical vapor deposition (PVD) process, an atomic layer deposition (ALD) process, or the like. The gate dielectric layer 104 is formed over the interface layer. The gate dielectric layer 104 may be deposited conformally in the recesses 102, such as on the top surfaces and the sidewalls of the fins 60. The gate dielectric layer 104 may also be formed along top surfaces of the ILD 100. The gate dielectric layer 104 may be a high-k dielectric material having a k value greater than about 7.0, and may include a metal oxide or a silicate of Hf, Al, Zr, La, Mg, Ba, Ti, Pb, and combinations thereof. The formation methods of the gate dielectric layer 104 may include Molecular-Beam Deposition (MBD), ALD, PECVD, and the like. A gate electrode layer is then deposited over the gate dielectric layer 104 and in the recesses 102. The gate electrode layer may be a metal-containing material such as TiN, TaN, TaC, Co, Ru, Al, combinations thereof, or multi-layers thereof. The gate electrode layer may include any number of work function tuning layers. A planarization process, such as a CMP, is performed to remove the excess portions of the gate dielectric layer 104 and gate electrode layer, which excess portions are over the top surface of the ILD 100. The remaining portions of the gate electrode layer form the gate electrodes 106, which in combination with the other layers, form replacement gates of the resulting FinFETs. The gate dielectric layers 104 and gate electrodes 106 may be collectively referred to as the "gates" or "gate stacks" of the resulting FinFETs. The gate stacks may extend along sidewalls of the channel region of the fins 60.

Figure 17B:
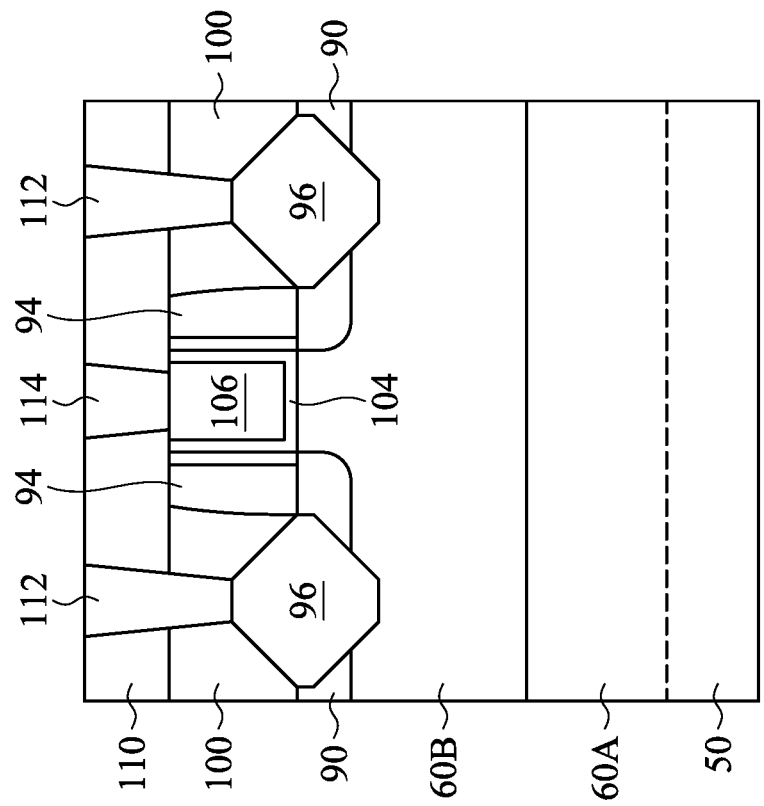
Figure 17A:
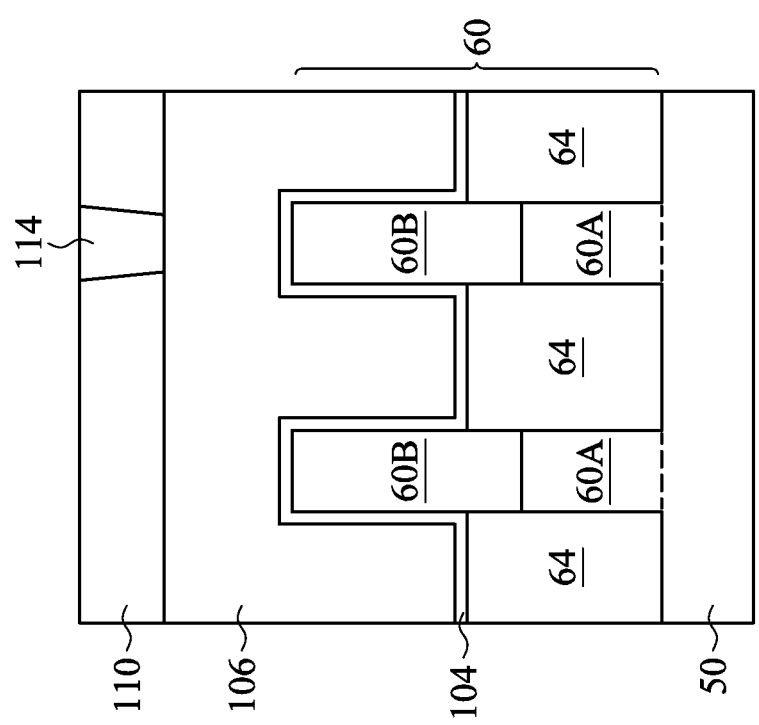

In FIGS. 17A and 17B, an ILD 110 is formed over the gate stacks and ILD 100. In an embodiment, the ILD 110 is a flowable film formed by a flowable CVD method. In some embodiments, the ILD 110 is formed of a dielectric material such as PSG, BSG, BPSG, USG, or the like, and may be deposited by any suitable method, such as CVD and PECVD.

Further, source/drain contacts 112 and gate contacts 114 are formed through the ILDs 100 and 110. Openings for the source/drain contacts 112 are formed through the ILDs 100 and 110, and openings for the gate contacts 114 are formed through the ILD 110. The openings may be formed using acceptable photolithography and etching techniques. A liner, such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the ILD 110. The remaining liner and conductive material form the source/drain contacts 112 and gate contacts 114 in the openings. An anneal process may be performed to form a silicide at the interface between the epitaxial source/drain regions 96 and the source/drain contacts 112. The source/drain contacts 112 are physically and electrically coupled to the epitaxial source/drain regions 96, and the gate contacts 114 are physically and electrically coupled to the gate electrodes 106. The source/drain contacts 112 and gate contacts 114 may be formed in different processes, or may be formed in the same process. Although shown as being formed in the same cross-sections, it should be appreciated that each of the source/drain contacts 112 and gate contacts 114 may be formed in different cross-sections, which may avoid shorting of the contacts.

In the embodiment described above, the germanium condensation process 66 is performed after the STI regions 64 are formed. However, it should be appreciated that the germanium condensation process 66 may be performed after other steps of a process for forming p-type devices.

Figure 18:
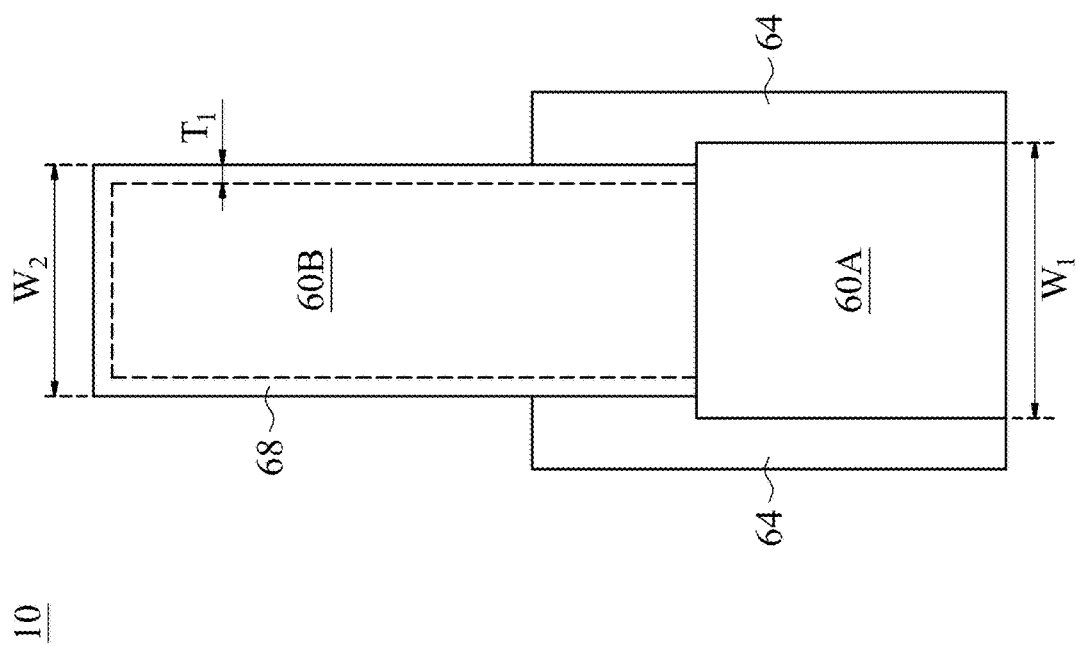
FIG. 18 is a cross-sectional view of a FinFET, in accordance with some other embodiments.

In some other embodiments, the germanium condensation process 66 is performed before the STI regions 64 are formed. FIG. 18 is a detailed view of the region 10 in FIG. 7, showing additional features of a fin 60 when the germanium condensation process 66 is performed before the STI regions 64 are formed. In such embodiments, the second portions 60B of the fins 60 may have a uniform second width $W_2$, with the first portions 60A of the fins 60 having a uniform third width $W_3$. The change in fin width many occur below the top surface of the STI regions 64. Because the first portions 60A may also be etched during the germanium condensation process 66, the third width $W_3$ may be less than the first width $W_1$ (see FIG. 8), and may be greater than the second width $W_2$.

Figure 19:
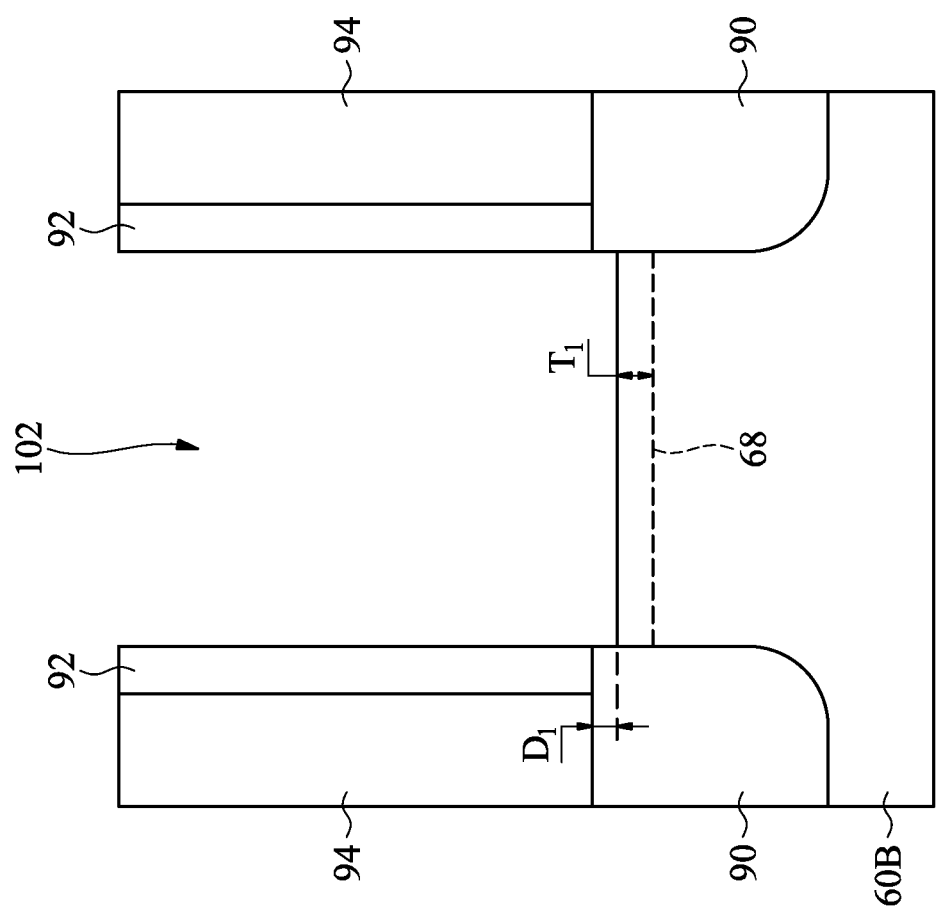
FIGS. 19, 20, 21, and 22 are cross-sectional views of a FinFET, in accordance with some other embodiments.
Figure 21:
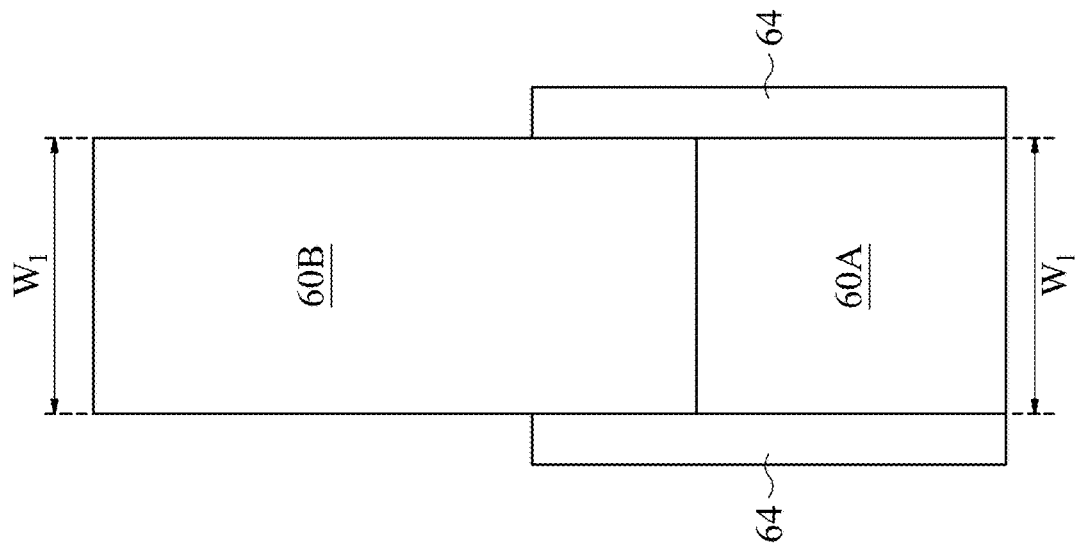
Figure 20:
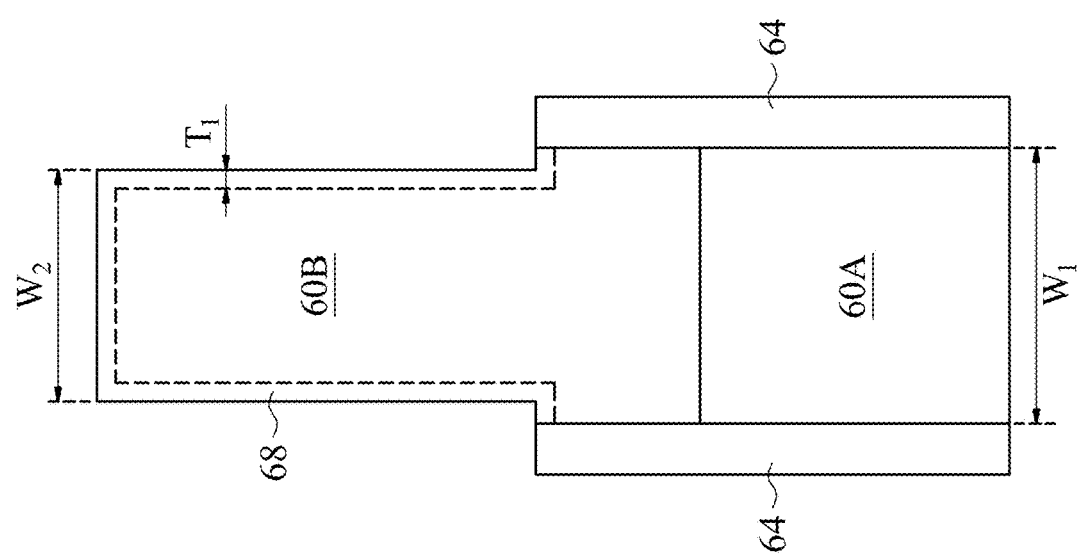
Figure 22:
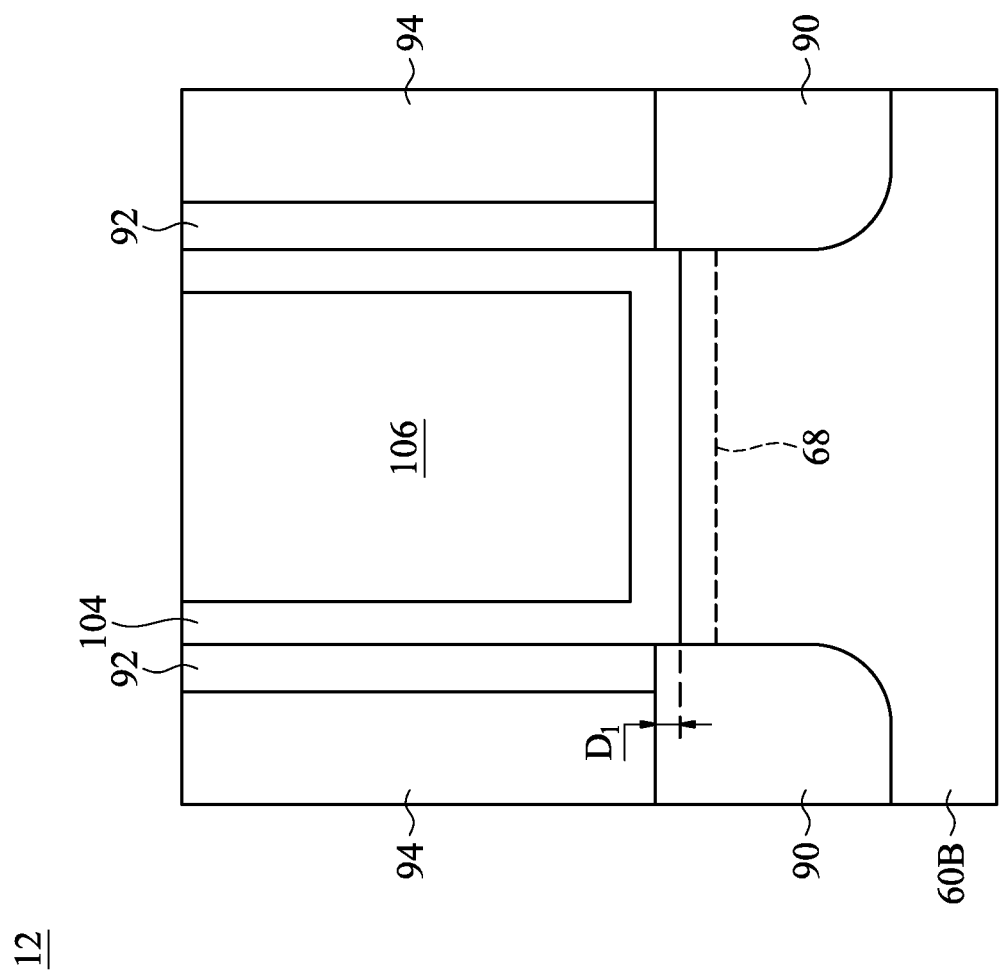

In some other embodiments, the germanium condensation process 66 is performed after the dummy gates 82 and dummy gate dielectric layers 84 are removed. FIG. 19 is a detailed view of the region 12 in FIG. 14B, showing additional features of a fin 60 when the germanium condensation process 66 is performed after the recesses 102 are formed. In such embodiments, the germanium-rich layers 68 only extend along portions of the fins 60 exposed by the recesses 102 (e.g., along the channel regions of the resulting FinFETs), and the LDD regions 90 may have a uniform germanium concentration. Further, only the portions of the fins 60 exposed by the recesses 102 have the second width $W_2$ (see FIG. 20). Other regions of the fins 60 (e.g., beneath the gate seal spacers 92 and gate spacers 94) may retain the first width $W_1$ (see FIG. 21). Finally, the germanium condensation process 66 may extend the recess 102 by a distance $D_1$, reducing the height of the fins 60 in the channel regions of the resulting FinFETs. As a result, bottom surfaces of the gate dielectric layers 104 are below topmost surfaces of the fins 60 (e.g., topmost surfaces of the LDD regions 90) (see FIG. 22).

Embodiments may achieve advantages. Forming the semiconductor layer 52 (see FIG. 3) with a low germanium concentration may help avoid deformation of fin sidewalls during the etching process(es) for forming the fins 60 (see FIG. 4). Increasing the germanium concentration of the fins 60 after formation by performing the germanium condensation process 66 (see FIG. 7) may allow the carrier mobility of the fins 60 to be increased after the etching process(es). The channel region mobility of the resulting p-type devices may therefore be increased, and the risk of fin deformation during manufacturing may be lowered.

In an embodiment, a method includes: growing a semiconductor layer on a substrate, the substrate including silicon, the semiconductor layer including silicon germanium; etching trenches in the semiconductor layer and the substrate to form a fin from portions of the semiconductor layer and substrate between the trenches; performing a hydrogen radical treatment process on a top surface and sides of the fin, a silicon concentration of the fin at the top surface and the sides of the fin being decreased after the hydrogen radical treatment process; and forming a metal gate stack along the top surface and the sides of the fin.

In some embodiments of the method, performing the hydrogen radical treatment process includes: dispensing a gas source including a first gas and a second gas on the top surface and the sides of the fin, the first gas being H2, the second gas being an inert gas; and generating a hydrogen plasma to convert the first gas into hydrogen radicals. In some embodiments of the method, performing the hydrogen radical treatment process further includes: forming silane from the hydrogen radicals and the silicon germanium of the fin at a first rate; and forming germane from the hydrogen radicals and the silicon germanium of the fin at a second rate, the second rate being less than the first rate. In some embodiments of the method, performing the hydrogen radical treatment process further includes: etching the top surface and the sides of the fin with the hydrogen plasma. In some embodiments of the method, the hydrogen radical treatment process is performed in an etch chamber, and performing the hydrogen radical treatment process further includes: removing the silane and the germane from the etch chamber while forming the silane and the germane. In some embodiments of the method, the hydrogen radical treatment process is performed at a temperature of from about 100° C. to about 600° C. In some embodiments of the method, the hydrogen radical treatment process is performed for a time span of less than about 100 seconds. In some embodiments of the method, the hydrogen radical treatment process is performed at a pressure of from about 0.1 Torr to about 6 Torr.

In an embodiment, a method includes: forming a fin extending from a substrate, the fin having a lower portion including silicon, the fin having an upper portion including silicon germanium; simultaneously removing silicon and germanium from sides and a top surface of the fin, the silicon removed at a first rate, the germanium removed at a second rate, the second rate being less than the first rate; and forming a source region and a drain region in the fin.

In some embodiments, the method further includes: before removing the silicon and germanium, forming an isolation region around the fin. In some embodiments, the method further includes: after removing the silicon and germanium, forming an isolation region around the fin. In some embodiments, the method further includes: before removing the silicon and germanium, forming a metal gate stack along the top surface and the sides of the fin. In some embodiments, the method further includes: after removing the silicon and germanium, forming a metal gate stack along the top surface and the sides of the fin. In some embodiments of the method, removing the silicon and germanium includes: exposing the top surface and the sides of the fin to a hydrogen radical, the hydrogen radical reacting with the silicon of the fin to form silane at the first rate, the hydrogen radical reacting with the germanium of the fin to form germane at the second rate.

In an embodiment, a device includes: a substrate; a first semiconductor layer extending from the substrate, the first semiconductor layer including silicon; a second semiconductor layer on the first semiconductor layer, the second semiconductor layer including silicon germanium, edge portions of the second semiconductor layer having a first germanium concentration, a center portion of the second semiconductor layer having a second germanium concentration, the second germanium concentration being less than the first germanium concentration, the edge portions of the second semiconductor layer including sides and a top surface of the second semiconductor layer; a gate stack on the second semiconductor layer; lightly doped source/drain regions in the second semiconductor layer, the lightly doped source/drain regions being adjacent the gate stack; and source and drain regions extending into the lightly doped source/drain regions.

In some embodiments of the device, the lightly doped source/drain regions have the second germanium concentration throughout. In some embodiments of the device, upper portions of the lightly doped source/drain regions have the first germanium concentration, and lower portions of the lightly doped source/drain regions have the second germanium concentration. In some embodiments of the device, the first semiconductor layer has a first width, a lower portion of the second semiconductor layer has the first width, and an upper portion of the second semiconductor layer has a second width, the second width being less than the first width. In some embodiments of the device, the first semiconductor layer has a first width, and upper and lower portions of the second semiconductor layer have a second width, the second width being less than the first width. In some embodiments of the device, the gate stack includes: a gate dielectric on the second semiconductor layer, a bottom surface of the gate dielectric being below top surfaces of the lightly doped source/drain regions; and a gate electrode on the gate dielectric.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    growing a semiconductor layer on a substrate, the substrate comprising silicon, the semiconductor layer comprising silicon germanium;
    etching trenches in the semiconductor layer and the substrate to form a fin comprising a first portion and a second portion, the first portion comprising a portion of the substrate between the trenches, the second portion comprising a portion of the semiconductor layer between the trenches, the first portion having a first width, the second portion having a second width;
    after etching the trenches in the semiconductor layer and the substrate, performing a hydrogen radical treatment process on a top surface and sides of the fin, a silicon concentration of the fin at the top surface and the sides of the fin being decreased after the hydrogen radical treatment process, the second width of the second portion of the fin being decreased after the hydrogen radical treatment process; and
    forming a metal gate stack along the top surface and the sides of the fin.

2. The method of claim 1, wherein performing the hydrogen radical treatment process comprises:
    dispensing a gas source comprising a first gas and a second gas on the top surface and the sides of the fin, the first gas being $H_2$, the second gas being an inert gas; and
    generating a hydrogen plasma to convert the first gas into hydrogen radicals.

3. The method of claim 2, wherein performing the hydrogen radical treatment process further comprises:
    forming silane from the hydrogen radicals and the silicon germanium of the fin at a first rate; and
    forming germane from the hydrogen radicals and the silicon germanium of the fin at a second rate, the second rate being less than the first rate.

4. The method of claim 3, wherein performing the hydrogen radical treatment process further comprises:
    etching the top surface and the sides of the fin with the hydrogen plasma.

5. The method of claim 3, wherein the hydrogen radical treatment process is performed in an etch chamber, and performing the hydrogen radical treatment process further comprises:
    removing the silane and the germane from the etch chamber while forming the silane and the germane.

6. The method of claim 1, wherein the hydrogen radical treatment process is performed at a temperature of from about 100° C. to about 600° C.

7. The method of claim 1, wherein the hydrogen radical treatment process is performed for a time span of less than about 100 seconds.

8. The method of claim 1, wherein the hydrogen radical treatment process is performed at a pressure of from about 0.1 Torr to about 6 Torr.

9. A method comprising:
    forming a fin extending from a substrate with an etching process, the fin having a lower portion comprising silicon, the fin having an upper portion comprising silicon germanium;
    simultaneously removing silicon and germanium from sides and a top surface of the fin with a hydrogen radical treatment process, the hydrogen radical treatment process different from the etching process, the silicon removed at a first rate, the germanium removed at a second rate, the second rate being less than the first rate;
    forming a lightly doped source/drain region in the fin, wherein upper portions of the lightly doped source/drain region have a first germanium concentration, and lower portions of the lightly doped source/drain region have a second germanium concentration, the second germanium concentration being less than the first germanium concentration; and
    forming a source region and a drain region in the fin, the source region or the drain region extending into the lightly doped source/drain region.

10. The method of claim 9 further comprising:
before removing the silicon and germanium, forming an isolation region around the fin.

11. The method of claim 9 further comprising:
after removing the silicon and germanium, forming an isolation region around the fin.

12. The method of claim 9 further comprising:
before removing the silicon and germanium, forming a dummy gate stack along the top surface and the sides of the fin; and
replacing the dummy gate stack with a metal gate stack.

13. The method of claim 9 further comprising:
after removing the silicon and germanium, forming a dummy gate stack along the top surface and the sides of the fin; and
replacing the dummy gate stack with a metal gate stack.

14. The method of claim 9, wherein the hydrogen radical treatment process comprises:
exposing the top surface and the sides of the fin to a hydrogen radical, the hydrogen radical reacting with the silicon of the fin to form silane at the first rate, the hydrogen radical reacting with the germanium of the fin to form germane at the second rate.

15. A device comprising:
a substrate;
a first semiconductor layer extending from the substrate, the first semiconductor layer comprising silicon;
a second semiconductor layer on the first semiconductor layer, the second semiconductor layer comprising silicon germanium, edge portions of the second semiconductor layer having a first germanium concentration, a center portion of the second semiconductor layer having a second germanium concentration, the second germanium concentration being less than the first germanium concentration, the edge portions of the second semiconductor layer comprising sides and a top surface of the second semiconductor layer;
a gate stack on the second semiconductor layer;
lightly doped source/drain regions in the second semiconductor layer, the lightly doped source/drain regions being adjacent the gate stack, wherein upper portions of the lightly doped source/drain regions have the first germanium concentration, and lower portions of the lightly doped source/drain regions have the second germanium concentration; and
source and drain regions extending into the lightly doped source/drain regions.

16. The device of claim 15, wherein the first semiconductor layer has a first width, a lower portion of the second semiconductor layer has the first width, and an upper portion of the second semiconductor layer has a second width, the second width being less than the first width.

17. The device of claim 15, wherein the first semiconductor layer has a first width, and upper and lower portions of the second semiconductor layer have a second width, the second width being less than the first width.

18. The device of claim 15, wherein the gate stack comprises:
a gate dielectric on the second semiconductor layer, a bottom surface of the gate dielectric being below top surfaces of the lightly doped source/drain regions; and
a gate electrode on the gate dielectric.

19. The method of claim 1 further comprising:
forming lightly doped source/drain regions in the semiconductor layer, the metal gate stack formed between the lightly doped source/drain regions, wherein upper portions of the lightly doped source/drain regions have a first germanium concentration, and lower portions of the lightly doped source/drain regions have a second germanium concentration, the second germanium concentration being less than the first germanium concentration.

20. The method of claim 1, wherein the first width of the first portion of the fin is decreased after the hydrogen radical treatment process.

* * * * *